US011516931B2

(12) United States Patent
Kim et al.

(10) Patent No.: US 11,516,931 B2
(45) Date of Patent: Nov. 29, 2022

(54) HINGE MODULE AND FOLDABLE DISPLAY DEVICE INCLUDING THE SAME

(71) Applicant: Samsung Electronics Co., Ltd., Gyeonggi-do (KR)

(72) Inventors: Jungjin Kim, Gyeonggi-do (KR); Jongyoon Kim, Gyeonggi-do (KR); Chungkeun Yoo, Gyeonggi-do (KR); Minsung Lee, Gyeonggi-do (KR)

(73) Assignee: Samsung Electronics Co., Ltd ( * ) Notice: Subject to any disclaimer, the term of this patent is extended or adjusted under 35 U.S.C. 154(b) by 470 days.

(21) Appl. No.: 16/794,590

(22) Filed: Feb. 19, 2020

(65) Prior Publication Data
US 2020/0267858 A1 Aug. 20, 2020

(30) Foreign Application Priority Data

Feb. 19, 2019 (KR) .................. 10-2019-0019559

(51) Int. Cl.
E05D 3/06 (2006.01)
H05K 5/02 (2006.01)
F16C 11/04 (2006.01)
E05D 11/00 (2006.01)
E05D 11/10 (2006.01)
H05K 5/00 (2006.01)
E05D 3/02 (2006.01)

(52) U.S. Cl.
CPC ............. H05K 5/0226 (2013.01); E05D 3/02 (2013.01); E05D 11/0054 (2013.01);
(Continued)

(58) Field of Classification Search
CPC ........ G06F 1/16; G06F 1/1616; G06F 1/1681; G06F 1/166; G06F 1/1679; H04M 1/022;
(Continued)

(56) References Cited

U.S. PATENT DOCUMENTS 8,302,261 B2    11/2012  Ma et al.
9,404,298 B1 *  8/2016   Chen .................... G06F 1/1681
(Continued)

FOREIGN PATENT DOCUMENTS

CN    207018340    2/2018
EP    3 355 159    8/2018
(Continued)

OTHER PUBLICATIONS

International Search Report dated Jun. 11, 2020 issued in counterpart application No. PCT/KR2020/002099, 8 pages.

Primary Examiner — Chuck Y Mah
(74) Attorney, Agent, or Firm — The Farrell Law Firm, P.C.

(57) ABSTRACT

Disclosed is a hinge module including a hinge structure having a first sub-hinge structure including a first center bracket and a first hinge bracket that rotates through a specified angle in a first direction and a second sub-hinge structure including a second center bracket and a second hinge bracket that rotates through a specified angle in an opposite direction to the first direction. The first hinge bracket and the second hinge bracket are separated from each other and are disposed between the first center bracket and the second center bracket, and hinge motion of the first sub-hinge structure is performed independently of hinge motion of the second sub-hinge structure. The hinge module and a foldable display device including the hinge module suppress a phenomenon in which the hinge module is opened when the housing structures are twisted, thereby preventing damage to the foldable display device.

20 Claims, 23 Drawing Sheets

(52) U.S. Cl.
CPC .............. *E05D 11/10* (2013.01); *F16C 11/04* (2013.01); *H05K 5/0017* (2013.01); *E05Y 2201/10* (2013.01); *E05Y 2201/218* (2013.01); *E05Y 2201/46* (2013.01); *E05Y 2900/606* (2013.01)

(58) Field of Classification Search
CPC ............. H04M 1/0214; H04M 1/0216; H04M 1/0222; H05K 5/0226; H05K 5/0017; F16M 11/10; E05D 11/0054; E05D 11/10; E05D 11/04; E05D 11/1021; E05D 11/1078; E05D 11/082; E05D 11/087; E05D 3/18; E05D 3/122; E05D 3/12; E05D 3/16; E05D 3/02; E05D 3/06; E05D 3/32; E05D 15/28; E05D 15/30; E05D 15/32; E05D 15/40; E05D 1/04; E05D 2001/045; E05Y 2900/606; E05Y 2201/10; E05Y 2201/218; E05Y 2201/46; Y10T 16/542; Y10T 16/543; Y10T 16/544; Y10T 16/5443; Y10T 16/5445; Y10T 16/5448; Y10T 16/545; Y10T 16/54038

See application file for complete search history.

(56) References Cited

U.S. PATENT DOCUMENTS

| | | | |
|---|---|---|---|
| 9,518,414 | B1 * | 12/2016 | Chen .................... E05D 11/082 |
| 9,772,659 | B2 | 9/2017 | Xin et al. |
| 9,990,006 | B2 | 6/2018 | Sprenger et al. |
| 10,001,815 | B1 * | 6/2018 | Yao ....................... H05K 5/0234 |
| 10,036,188 | B1 | 7/2018 | Yao et al. |
| 10,309,137 | B2 * | 6/2019 | Wu .......................... F16C 11/04 |
| 10,310,551 | B2 | 6/2019 | Bae et al. |
| 10,359,805 | B2 | 7/2019 | Huang et al. |
| 10,365,691 | B2 | 7/2019 | Bae et al. |
| 10,416,726 | B2 | 9/2019 | Lin |
| 10,480,225 | B1 * | 11/2019 | Hsu ............................ E05D 3/12 |
| 10,656,685 | B2 * | 5/2020 | Cheng ................... G06F 1/1681 |
| 10,921,863 | B2 * | 2/2021 | Gault ...................... H04M 1/022 |
| 11,353,931 | B2 * | 6/2022 | Hsu ....................... G06F 1/1681 |
| 2011/0133619 | A1 | 6/2011 | Ma et al. |
| 2013/0002114 | A1 | 1/2013 | Hamers et al. |
| 2017/0023986 | A1 | 1/2017 | Xin |
| 2017/0344074 | A1 | 11/2017 | Sprenger et al. |
| 2018/0081395 | A1 | 3/2018 | Huang et al. |
| 2018/0210513 | A1 | 7/2018 | Lin |
| 2018/0292863 | A1 * | 10/2018 | Escamilla ............. G06F 1/1647 |
| 2018/0313399 | A1 | 11/2018 | Nakamura |
| 2019/0094917 | A1 * | 3/2019 | Schmelzle .......... E05D 11/0081 |
| 2020/0363843 | A1 * | 11/2020 | Cheng .................... H04M 1/02 |
| 2021/0267076 | A1 * | 8/2021 | Zhang ................. E05D 11/1014 |

FOREIGN PATENT DOCUMENTS

| | | |
|---|---|---|
| KR | 1020160121350 | 10/2016 |
| KR | 1020160144299 | 12/2016 |
| KR | 10-1847047 | 4/2018 |
| KR | 1020180125650 | 11/2018 |
| WO | WO 2006/008955 | 1/2006 |
| WO | WO 2017/204367 | 11/2017 |

* cited by examiner

HINGE MODULE AND FOLDABLE DISPLAY DEVICE INCLUDING THE SAME

CROSS-REFERENCE TO RELATED APPLICATION(S)

This application is based on and claims priority under 35 U.S.C. § 119 to Korean Patent Application No. 10-2019-0019559, filed on Feb. 19, 2019, in the Korean Intellectual Property Office, the disclosure of which is incorporated by reference herein in its entirety.

BACKGROUND

1. Field

The disclosure relates generally to a portable electronic device, and more particularly, to a foldable display device for a portable electronic device.

2. Description of Related Art

A portable electronic device, such as a smartphone, may provide various functions, such as a telephone call, video playback, and Internet search, based on various applications. A user may wish to use the functions through a wider screen, for convenience. However, portability tends to decrease with an increase in screen size. Accordingly, a foldable portable electronic device capable of increasing portability using a folding structure has been developed.

In the foldable electronic device, a hinge structure may be connected with adjacent housing structures, and the hinge structure may perform a rotary motion while supporting the housing structures, while the housing structures rotate through a predetermined angle. However, fixed positions between the housing structures and the hinge structure may differ from each other, giving rise to a phenomenon in which the hinge portion is opened when a user holds opposite sides of the foldable electronic device in a flat state and twists the foldable electronic device.

This opening phenomenon may apply stress to the coupling relationship between the housing structures and the hinge structure, which results in damage to the foldable electronic device. Furthermore, gaps may be formed between the housing structures and the hinge structure, enabling foreign matter to infiltrate through the gaps. Accordingly, there is a need in the art for a foldable display device that more seamlessly and conveniently operates with the electronic device.

SUMMARY

Aspects of the disclosure are to address at least the above-mentioned problems and/or disadvantages and to provide at least the advantages described below.

Accordingly, an aspect of the disclosure is to provide a foldable display device including a hinge module that suppresses twisting while housing structures perform hinge motions about a hinge structure.

Another aspect of the disclosure is to provide a hinge module that suppresses twisting by forming the hinge structure such that the positions where the housing structures and the hinge structure are coupled are similar to each other.

In accordance with an aspect of the disclosure, a hinge module (or a hinge device) includes a hinge housing, and at least one hinge structure mounted in the hinge housing, wherein the at least one hinge structure includes a first sub-hinge structure including a first center bracket fixed to the hinge housing and a first hinge bracket connected with the first center bracket and coupled to a first housing structure, the first hinge bracket being rotatable through an angle in a first direction to correspond to a hinge motion of the first housing structure, and a second sub-hinge structure including a second center bracket spaced apart from the first center bracket by a predetermined distance and fixed to the hinge housing and a second hinge bracket connected with the second center bracket and coupled to a second housing structure, the second hinge bracket being rotatable through an angle in a second direction opposite to the first direction, wherein the first hinge bracket and the second hinge bracket are disposed to be separated from each other, and wherein hinge motion of the first sub-hinge structure is performed independently of a hinge motion of the second sub-hinge structure.

In accordance with another aspect of the disclosure, a foldable display device includes a first housing structure, a second housing structure, a hinge module configured to connect the first housing structure to the second housing structure and support hinge motions of the first housing structure and the second housing structure, and a display continuously disposed on the first housing structure and the second housing structure, wherein the hinge module includes a hinge housing, and at least one hinge structure mounted in the hinge housing, wherein the at least one hinge structure includes a first sub-hinge structure including a first center bracket fixed to the hinge housing and a first hinge bracket connected with the first center bracket and coupled to the first housing structure, the first hinge bracket being configured to rotate through an angle in a first direction to correspond to a hinge motion of the first housing structure, and a second sub-hinge structure including a second center bracket spaced apart from the first center bracket by a predetermined distance and fixed to the hinge housing and a second hinge bracket connected with the second center bracket and coupled to the second housing structure, the second hinge bracket being configured to rotate through an angle in a second direction opposite to the first direction, wherein the first hinge bracket and the second hinge bracket are disposed to be separated from each other, and wherein hinge motion of the first sub-hinge structure is performed independently of a hinge motion of the second sub-hinge structure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
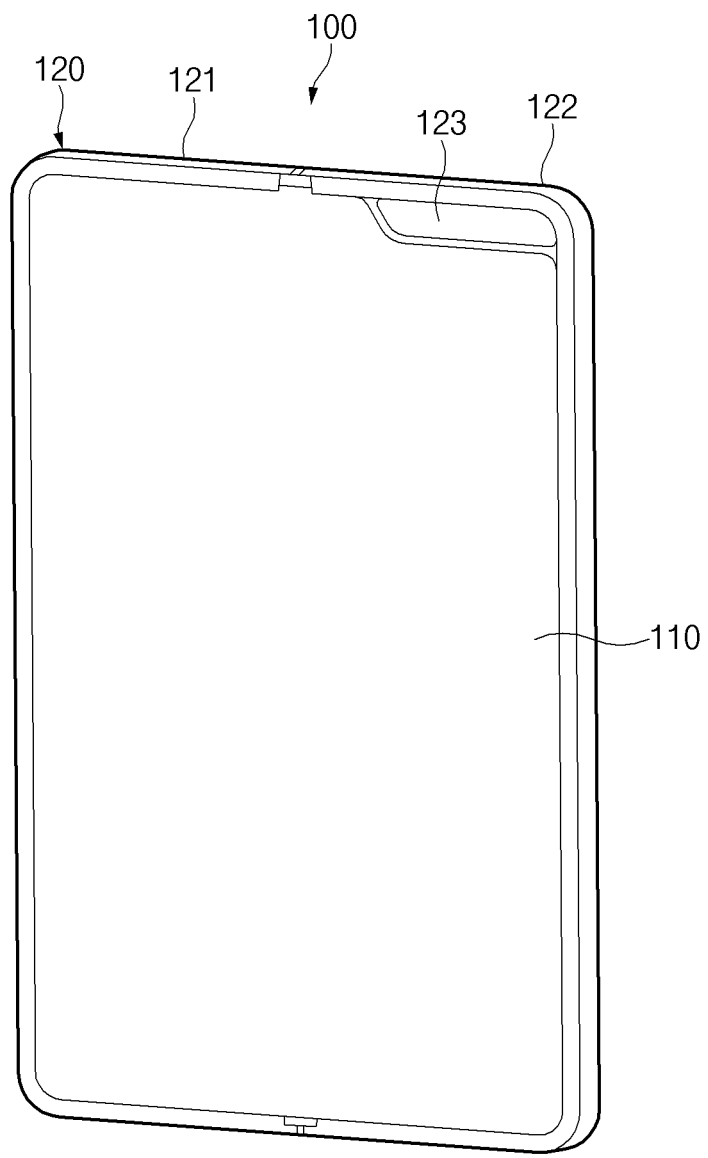
FIG. 1A illustrates the front exterior of a foldable display device in a first state according to an embodiment.

Embodiments of the disclosure will be described with reference to accompanying drawings. Accordingly, those of ordinary skill in the art will recognize that modifications, equivalents, and/or alternatives on the embodiments described herein can be made without departing from the scope and spirit of the disclosure. With regard to description of drawings, similar components may be marked by similar reference numerals. Detailed descriptions of known functions and/or configurations will be omitted for the sake of clarity and conciseness.

Expressions such as "have", "may have", "include" and "comprise", or "may include" and "may comprise" used herein indicate existence of corresponding components such as numeric values, functions, operations, or parts, but do not exclude the presence of additional features.

Expressions such as "A or B", "at least one of A or/and B", or "one or more of A or/and B", may include any and all combinations of one or more of the associated listed items. For example, expressions such as "A or B", "at least one of A and B", or "at least one of A or B" may refer to when at least one A is included, when at least one B is included, or when both of at least one A and at least one B are included.

Terms such as "first" and "second" used in the disclosure may refer to various components regardless of the order and/or the priority and to distinguish the relevant components from other components, but do not limit the components. For example, "a first user device" and "a second user device" indicate different user devices regardless of the order or priority. A first component may be referred to as a second component, and similarly, a second component may be referred to as a first component.

It will be understood that when a component (e.g., a first component) is referred to as being operatively or communicatively coupled with/to or connected to another component (e.g., a second component), the first component may be directly coupled with/to or connected to the second component or an intervening component (e.g., a third component) may be present. In contrast, when the first component is referred to as being directly coupled with/to or directly connected to the second component, it should be understood that there is no intervening third component present.

According to the situation, the expression "configured to" used in the disclosure may be used as the expression "suitable for", "having the capacity to", "designed to", "adapted to", "made to", or "capable of".

The expression "configured to" does not only indicate "specifically designed to" in hardware, and the expression "a device configured to" may indicate that the device is "capable of" operating together with another device or other parts. For example, a "processor configured to (or set to) perform A, B, and C" may indicate a dedicated processor for performing a corresponding operation or a central processing unit (CPU) or an application processor (AP) which performs corresponding operations by executing one or more software programs which are stored in a memory device.

Terms used in the disclosure are used to describe specified embodiments and are not intended to limit the scope of the disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the related art and not in an idealized or overly formal unless expressly so defined in embodiments of the disclosure. In some cases, even if terms are herein defined, the terms may not be interpreted to exclude embodiments of the disclosure.

An electronic device according to embodiments may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), motion picture experts group (MPEG-1 or MPEG-2) audio layer 3 (MP3) players, mobile medical devices, cameras, or wearable devices. The wearable device may include at least one of an accessory type (e.g., watches, rings, bracelets, anklets, necklaces, glasses, contact lens, or head-mounted-devices (HMDs)), a fabric or garment-integrated type (e.g., an electronic apparel), a body-attached type (e.g., a skin pad or tattoos), or a bio-implantable type (e.g., an implantable circuit).

Herein, the term "user" may refer to a person who uses an electronic device or to an artificial intelligence electronic device that uses the electronic device.

Figure 1B:
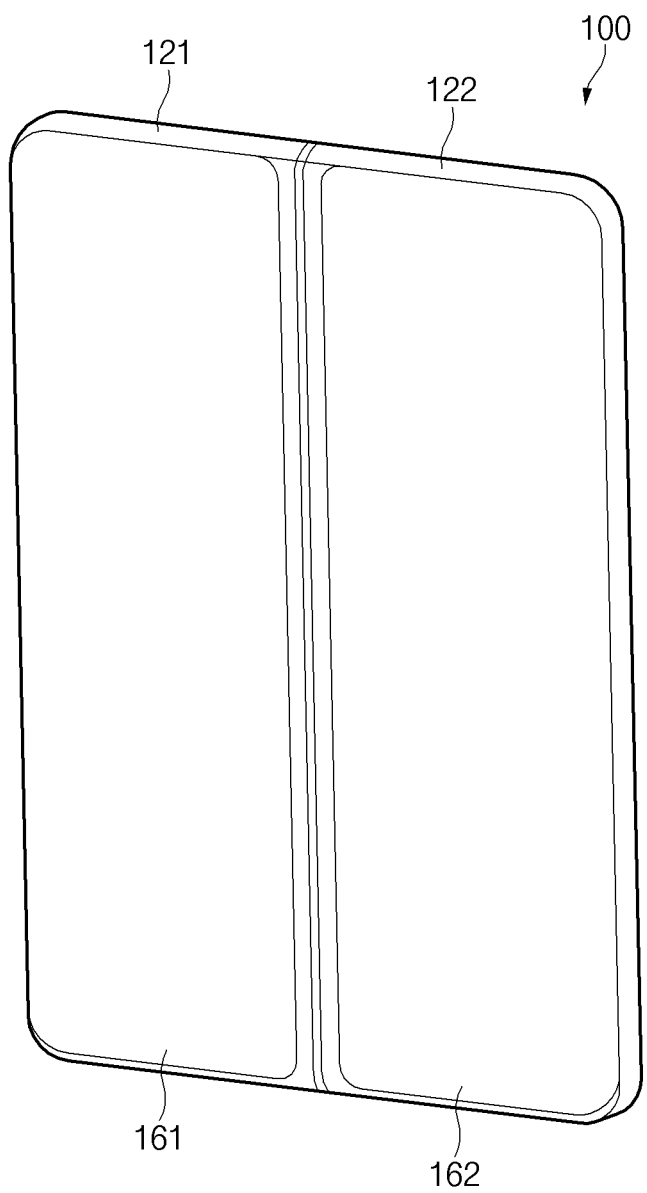
FIG. 1B illustrates the rear exterior of the foldable display device in the first state according to an embodiment.
Figure 1C:
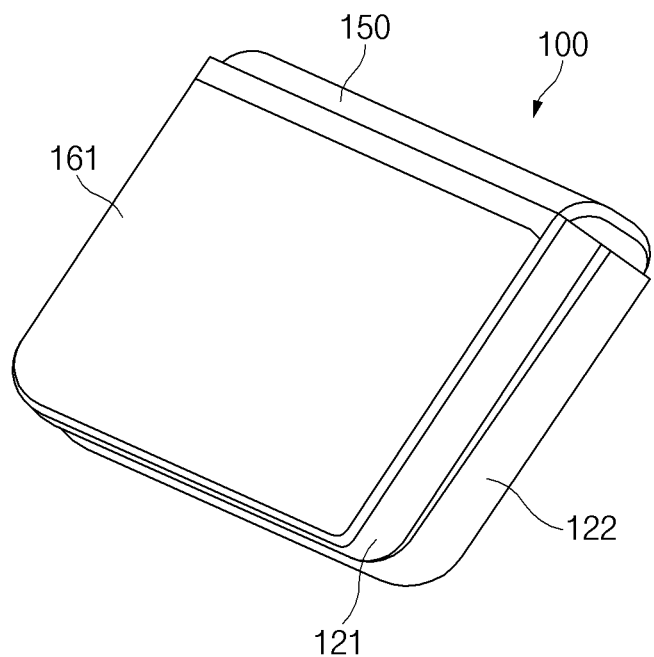
FIG. 1C illustrates an example of the exterior of the foldable display device in a second state according to an embodiment.
Figure 1D:
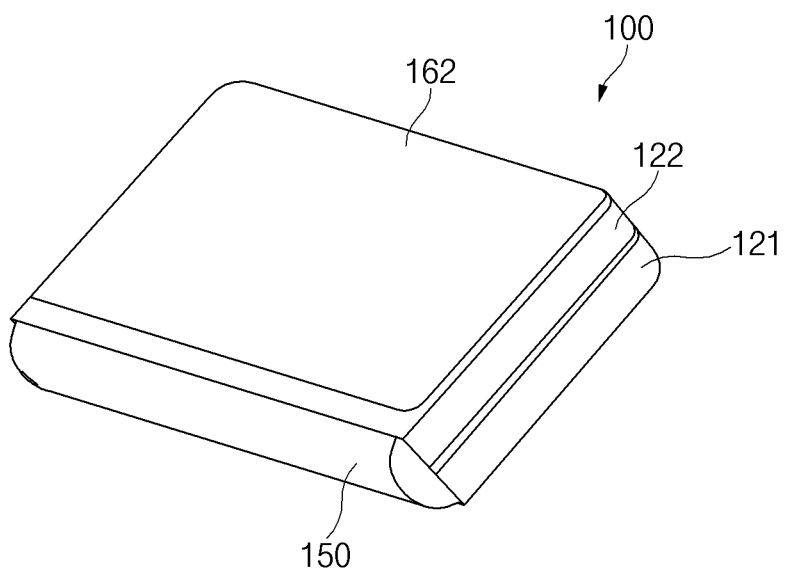
FIG. 1D illustrates another example of the exterior of the foldable display device in the second state according to an embodiment.

FIG. 1A illustrates the front exterior of a foldable display device in a first state according to an embodiment. FIG. 1B illustrates the rear exterior of the foldable display device in the first state according to an embodiment. FIG. 1C illustrates an example of the exterior of the foldable display device in a second state according to an embodiment. FIG. 1D illustrates another example of the exterior of the foldable display device in the second state according to an embodiment.

Referring to FIGS. 1A, 1B, 1C and 1D, the foldable display device 100 may include a housing 120 including a first housing structure 121 and a second housing structure 122, a display 110 (e.g., a flexible display), a first cover 161, a second cover 162, and a hinge housing 150 in which is disposed a hinge structure. FIGS. 1A and 1B illustrate the front side and the rear side of the foldable display device 100 in the first state (e.g., a flat state or an unfolded state), and FIGS. 1C and 1D are perspective views including the upper and lower sides (or the left and right sides) of the foldable display device 100 in the second state (e.g., a folded state).

Depending on an arrangement, the first housing structure 121 may be disposed so as to be continuous with the second housing structure 122 when the central portion of the display 110 is flat, or may be disposed side by side with the second housing structure 122. Alternatively, when the central portion of the display 110 is folded, one side of the first housing structure 121 may face one side of the second housing structure 122.

At least a portion of the first housing structure 121 may be formed of a metallic material or a non-metallic material. For example, the first housing structure 121 may be formed of a material having a predetermined stiffness to support at least a portion of the display 110. One area of the display 110 may be disposed on a portion of the front side of the first housing structure 121. The first housing structure 121 may include an empty space, or may be coupled with the first cover 161 to form an empty space. Electronic components, such as a printed circuit board (PCB), and at least one processor and memory and a battery, which are mounted on the PCB, that are required to drive the display 110 may be disposed in the empty space. The periphery of the first housing structure 121 may be provided in a form that surrounds a periphery on one side of the display 110.

The second housing structure 122 may be disposed side by side with the first housing structure 121 or may be disposed such that at least one side of the second housing structure 122 faces the first housing structure 121. The second housing structure 122 may be formed of the same material as that of the first housing structure 121 and may be disposed to be horizontally or vertically symmetric to the first housing structure 121. At least a portion of the remaining area of the display 110 may be disposed and supported on the front side of the second housing structure 122. Similar to the first housing structure 121, the second housing structure 122 may include an empty space, or may be coupled with the second cover 162 to form an empty space. Electronic components required to drive the display 110 may be disposed in the empty space. The periphery of the second housing structure 122 may be provided in a form that surrounds a periphery on an opposite side of the display 110.

The foldable display device 100 may include, on one side of the second housing structure 122, a sensor arrangement area 123 in which at least one sensor associated with operating a specific function of the foldable display device 100 is disposed. For example, at least one of a proximity sensor, an illuminance sensor, an iris sensor, an image sensor (or a camera), and a fingerprint sensor may be disposed in the sensor arrangement area 123. The sensor arrangement area 123 may be disposed on the rear side of the foldable display device 100 when the at least one sensor is disposed on the rear side of the foldable display device 100.

The hinge housing 150 may be hidden by one side of the first housing structure 121 and one side of the second housing structure 122 in a flat state of the housing 120, or may be exposed to the outside in a folded state of the housing 120. For example, as illustrated in FIGS. 1A and 1B, the hinge housing 150 may be hidden by the first housing structure 121 and the second housing structure 122 when the first housing structure 121 and the second housing structure 122 are arranged side by side. As illustrated in FIGS. 1C and 1D, the hinge housing 150 may be exposed to the outside from between lateral portions of the first housing structure 121 and the second housing structure 122 when one side of the first housing structure 121 and one side of the second housing structure 122 face each other.

At least a portion of the display 110 may be provided in a foldable manner. The display 110 may include a first area disposed on the first housing structure 121, a second area disposed on the second housing structure 122, and a central area within a predetermined range with respect to the area to which the first housing structure 121 and the second housing structure 122 are adjacent. At least a portion of the central area may be flexible.

Figure 2:
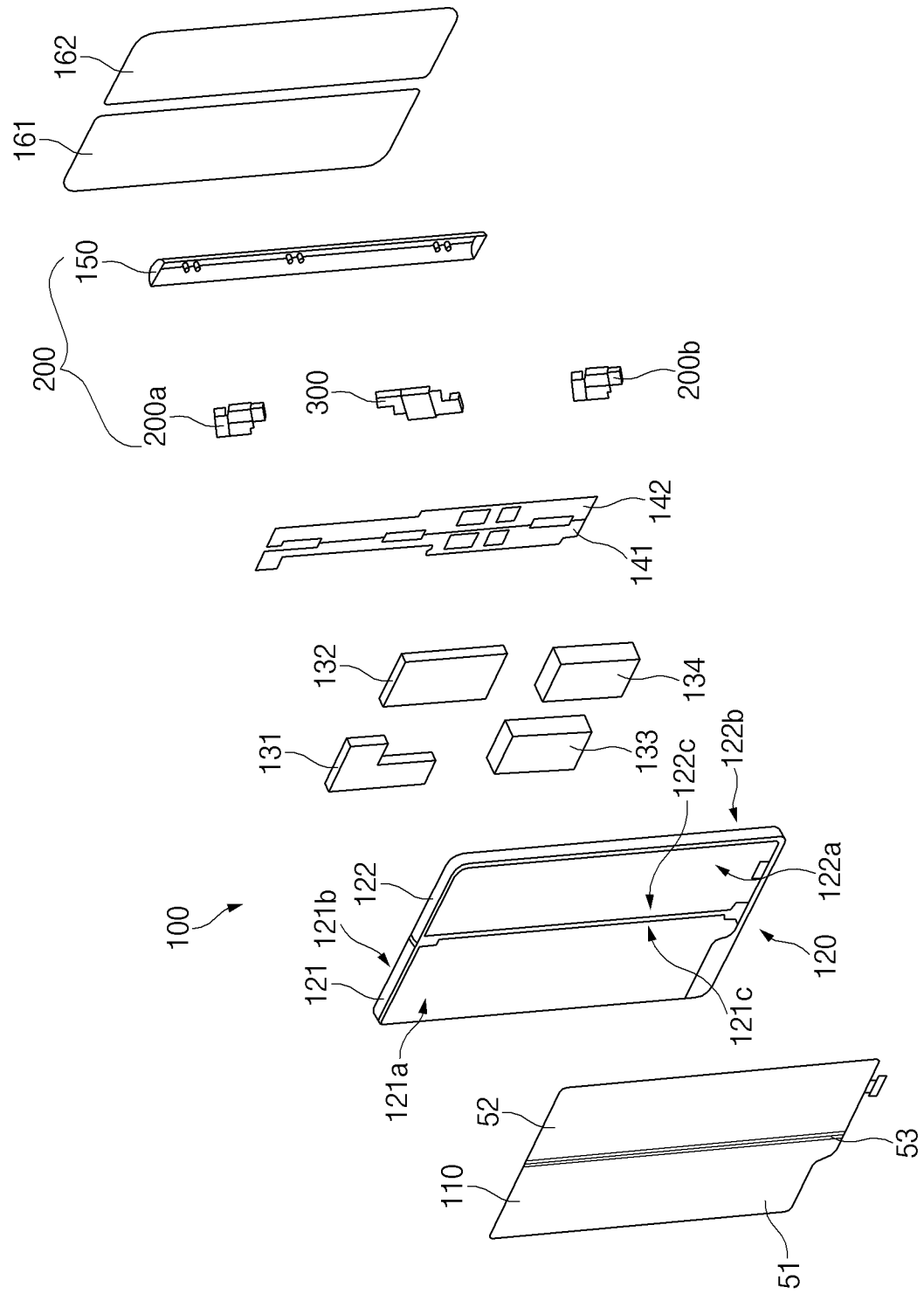
FIG. 2 is an exploded perspective view of the foldable display device according to an embodiment.

FIG. 2 is an exploded perspective view of the foldable display device according to an embodiment.

Referring to FIG. 2, the foldable display device 100 may include the display 110, the housing 120, a first PCB 131 and a second PCB 132, a first battery 133 and a second battery 134, hinge plates 141 and 142, a hinge structure 200, the first cover 161, and the second cover 162.

The display 110 may include a first area 51, a second area 52, and a central area 53. The central area 53 may include a predetermined area that is located on the central portion of the inside of the display 110 while the display 110 is folded. At least a portion of the first area 51 may be fixedly attached to the first housing structure 121. At least a portion of the second area 52 may be fixedly attached to the second housing structure 122. The central area 53 may be disposed so as not to be fixed (or attached) to the first housing structure 121 and the second housing structure 122. Accordingly, the central area 53 may be moved without being attached to the first housing structure 121 and the second housing structure 122 while the display 110 is folded or unfolded.

The first housing structure 121 may include a first surface 121a and a second surface 121b opposite to the first surface 121a, and the second housing structure 122 may include a third surface 122a and a fourth surface 122b opposite to the third surface 122a. The first housing structure 121 and the second housing structure 122 may be folded or unfolded about the hinge structure 200. The third surface 122a may face the first surface 121a when the display 110 is folded (i.e., when the first housing structure 121 and the second housing structure 122 are stacked on each other). The first surface 121a and the third surface 122a may face the same direction with a first peripheral portion 121c of the first housing structure 121 being connected with a second peripheral portion 122c of the second housing structure 122 when the display 110 is unfolded. The display 110 (or the flexible display layer) may be disposed across at least a portion of the first surface 121a and at least a portion of the third surface 122a. The display 110 may be folded at or in adjacent areas of the first peripheral portion 121c and the second peripheral portion 122c.

The first PCB 131 may be disposed between the second surface 121b of the first housing structure 121 and the first cover 161. The second PCB 132 may be disposed between the fourth surface 122b of the second housing structure 122 and the second cover 162. Alternatively, the first PCB 131 and the second PCB 132 may be integrated into one PCB and may be disposed between the second surface 121b of the first housing structure 121 and the first cover 161 or between the fourth surface 122b of the second housing structure 122 and the second cover 162. Various electronic components required to drive the foldable display device 100 may be disposed on the first PCB 131 and the second PCB 132. For example, a memory, at least one processor, communication circuitry, an antenna, a microphone, a speaker, at least one sensor and an electronic component associated with driving the sensor, and a camera, may be mounted on at least one of the first PCB 131 and the second PCB 132.

The first battery 133 may be disposed between the second surface 121b of the first housing structure 121 and the first cover 161. The second battery 134 may be disposed between the fourth surface 122b of the second housing structure 122 and the second cover 162. The first battery 133 and the second battery 134 may supply power required to drive the foldable display device 100. The first battery 133 and the second battery 134 may supply power to at least one of the first PCB 131 and the second PCB 132, the display 110, and at least one sensor, through interconnections. Although it has been described that the foldable display device 100 includes the plurality of batteries, the disclosure is not limited thereto. For example, the foldable display device 100 may include only one battery.

The hinge plates 141 and 142 may include the first hinge plate 141 coupled with the first housing structure 121 and one side of the hinge module 200 and the second hinge plate 142 coupled with the second housing structure 122 and an opposite side of the hinge module 200. The first hinge plate 141 may be fixed, at one side thereof, to the edge of the first housing structure 121 that is adjacent to the second housing structure 122 and may be fixed, at an opposite side thereof, to a portion of each of hinge structures 200a, 300, and 200b that are included in the hinge module 200. Accordingly, a force applied while a user folds or unfolds the first housing structure 121 or the second housing structure 122 may be transmitted to at least a portion of each of the hinge structures 200a, 200b, and 300.

The second hinge plate 142 may be fixed, at one side thereof, to the edge of the second housing structure 122 that is adjacent to the first housing structure 121 and may be fixed, at an opposite side thereof, to the remaining portion of each of the hinge structures 200a, 300, and 200b that are included in the hinge module 200. Accordingly, a force generated while the user folds or unfolds the first housing structure 121 or the second housing structure 122 may be transmitted to at least the remaining portion of each of the hinge structures 200a, 200b, and 300.

The hinge module 200 may include the hinge housing 150 (or the hinge cover), the first hinge structure 200a, the second hinge structure 200b, and the third hinge structure 300.

The hinge housing 150 may have a semi-cylindrical (or semi-elliptical) structure that is closed at both ends. The hinge housing 150 may include an empty space formed inside the hinge housing 150, in which the first hinge structure 200a, the second hinge structure 200b, and the third hinge structure 300 are mounted. The hinge housing 150 may be formed to have a length that corresponds to the length of the display 110 or the first housing structure 121 in the longitudinal direction, and may have a semi-circular, semi-elliptical, or partially-curved cross-section.

The first hinge structure 200a may be disposed at one point of the hinge housing 150 that is symmetric to the second hinge structure 200b with respect to the central portion of the hinge housing 150. For example, the first hinge structure 200a may be disposed to be biased to an upper side with respect to the central portion of the illustrated hinge housing 150. The first hinge structure 200a may be disposed adjacent to the upper end of the hinge housing 150 to minimize twisting of the housing structures 121 and 122 at the one end of the hinge housing 150 during hinge motions of the housing structures 121 and 122.

A portion of the first hinge structure 200a may be fixed to the hinge housing 150, and other portions of the first hinge structure 200a may be coupled to the hinge plates 141 and 142. For example, one side of the first hinge structure 200a may be coupled with one side of the first hinge plate 141, and an opposite side of the first hinge structure 200a may be coupled to one side of the second hinge plate 142. The first hinge structure 200a may perform hinge motion to correspond to rotary motions of the hinge plates 141 and 142 coupled to the first hinge structure 200a. Two sub-hinge structures of the first hinge structure 200a may be alternately disposed and may perform hinge motions independently of hinge motions of the hinge plates 141 and 142. At least a portion of the first hinge structure 200a may be formed of a metallic material.

The second hinge structure 200b may be disposed at an opposite point of the hinge housing 150 that is symmetric to the first hinge structure 200a with respect to the central portion of the hinge housing 150. Alternatively, the second hinge structure 200b may be disposed to be biased to a lower side with respect to the central portion of the illustrated hinge housing 150. The second hinge structure 200b may be disposed adjacent to the lower end of the hinge housing 150 to minimize twisting of the housing structures 121 and 122 at the opposite end of the hinge housing 150 during hinge motions of the housing structures 121 and 122. In this regard, a portion of the second hinge structure 200b may be fixed to the hinge housing 150, and other portions of the second hinge structure 200b may be coupled to the hinge plates 141 and 142.

For example, one side of the second hinge structure 200b may be coupled with an opposite side of the first hinge plate 141, and an opposite side of the second hinge structure 200b may be coupled to an opposite side of the second hinge plate 142. The second hinge structure 200b may perform a hinge motion to correspond to rotary motions of the hinge plates 141 and 142 coupled to the second hinge structure 200b. Similar to the first hinge structure 200a, the second hinge structure 200b may include two sub-hinge structures that may be alternately disposed and may perform hinge motions independently of hinge motions of the hinge plates 141 and 142. The second hinge structure 200b may be formed of the same material as that of the first hinge structure 200a and may have substantially the same structure and shape as the first hinge structure 200a, but may differ from the first hinge structure 200a in terms of the position on the hinge housing 150.

The third hinge structure 300 may be disposed on the central portion of the hinge housing 150. A portion of the third hinge structure 300 may be fixed to the hinge housing 150, and other portions of the third hinge structure 300 may be connected to the first hinge plate 141 and the second hinge plate 142. The third hinge structure 300 may transmit a force through interlocking gears such that the first hinge plate 141 and the first housing structure 121 coupled to the first hinge plate 141 (or the second hinge plate 142 and the second housing structure 122 coupled to the second hinge plate 142) perform hinge motion together with the second hinge plate 142 and the second housing structure 122 coupled to the second hinge plate 142 (or the first hinge plate 141 and the first housing structure 121 coupled to the first hinge plate 141).

The first cover 161 may be disposed on the rear surface of the first housing structure 121 to cover at least a portion of the second surface 121b of the first housing structure 121. The first cover 161 may be disposed to cover a portion of the hinge module 200 (e.g., one side of the hinge housing 150) that is disposed between the first housing structure 121 and the second housing structure 122. The first cover 161 may have rounded corners. The first cover 161 may have an empty space inside, or may be fastened with the second surface 121b of the first housing structure 121 to form an empty space between the first housing structure 121 and the first cover 161. For example, the first cover 161 may have a rectangular bottom surface and sidewalls formed on an upper side and left and right sides of the bottom surface.

The second cover 162 may be disposed adjacent to the first cover 161 and may be fastened to the fourth surface 122b of the second housing structure 122 to cover at least a portion of the fourth surface 122b. The second cover 162 may be disposed to cover the opposite side of the hinge housing 150 that is partly hidden by the first cover 161. The second cover 162 may have rounded corners, similar to the first cover 161. The second cover 162 may have an empty space inside, or may be fastened with the fourth surface 122b of the second housing structure 122 to form an empty space between the second housing structure 122 and the second cover 162. In this regard, the second cover 162 may have a structure with a rectangular bottom surface and sidewalls formed on a lower side and left and right sides of the bottom surface.

Although it has been described that the first hinge structure 200a and the second hinge structure 200b are disposed at the opposite ends of the hinge housing 150 with respect to the central portion of the hinge housing 150 and the third hinge structure 300 is disposed between the first hinge structure 200a and the second hinge structure 200b, the disclosure is not limited thereto. For example, only one of the first hinge structure 200a and the second hinge structure 200b that perform hinge motion may be disposed in the hinge housing 150. For example, in the foldable display device 100, the first hinge structure 200a having a non-interlocking structure may be disposed at the one end of the hinge housing 150, and a plurality of hinge structures in the type of the third hinge structure 300 (e.g., an interlocking structure including interlocking gears) may be disposed on the central portion of the hinge housing 150 or at the opposite end of the hinge housing 150.

Figure 3:
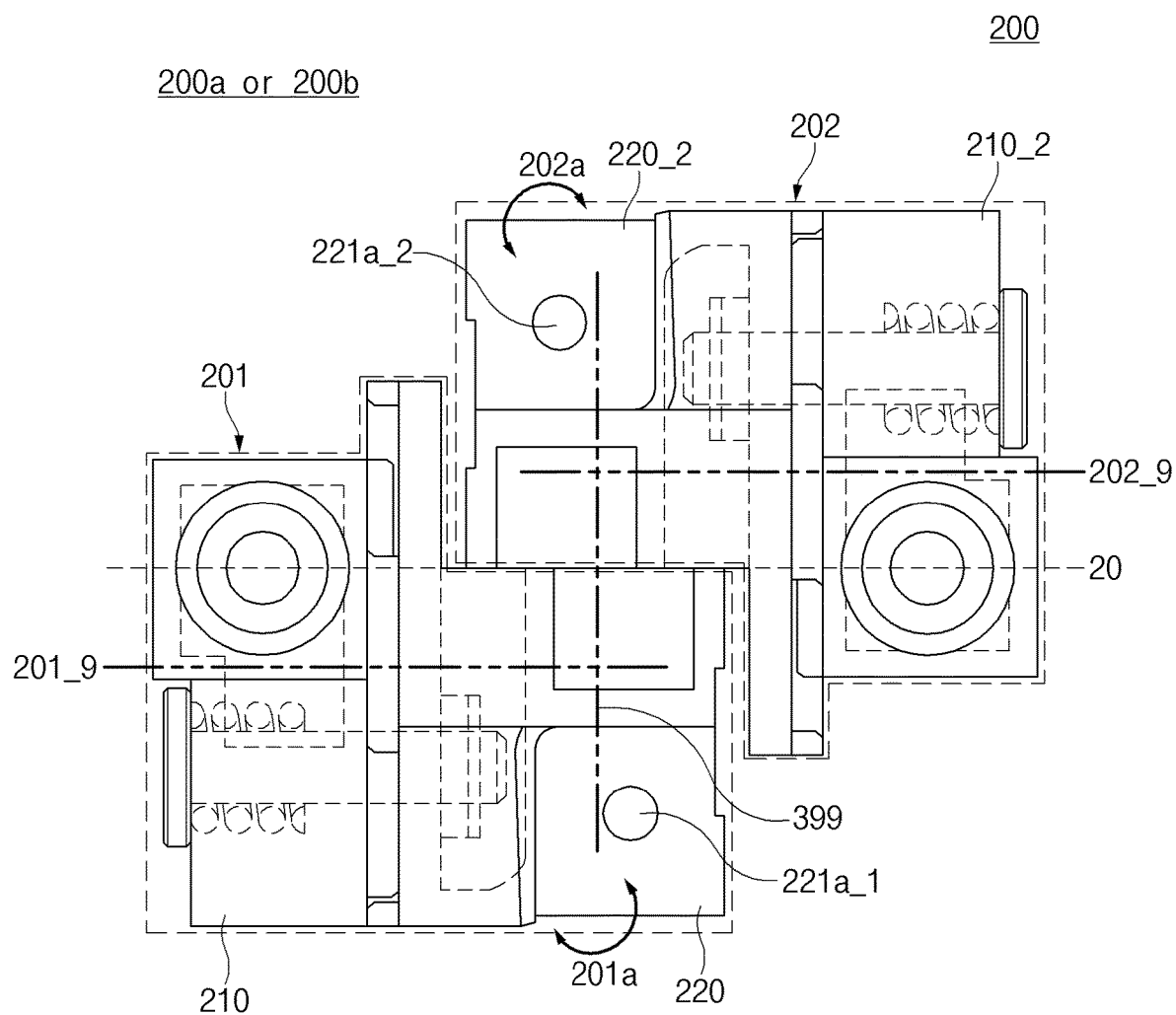
FIG. 3 illustrates a first hinge structure or a second hinge structure according to an embodiment.

FIG. 3 illustrates the first hinge structure or the second hinge structure according to an embodiment.

Referring to FIG. 3, the first hinge structure 200a (or the second hinge structure 200b) may include a first sub-hinge structure 201 and a second sub-hinge structure 202 having substantially the same configuration and may be disposed to alternate with each other. For example, the first sub-hinge structure 201 may include a first center bracket 210 and a first hinge bracket 220. The second sub-hinge structure 202 may include a second center bracket 210_2 that has the same shape as the first center bracket 210 and that is disposed to be directed opposite to the first center bracket 210 and a second hinge bracket 220_2 that has the same shape as the first hinge bracket 220 and that is disposed to be directed opposite to the first hinge bracket 220. The first center bracket 210 and the second center bracket 210_2 may be arranged with respect to a fixed axis 20 and may be fixed to the hinge housing 150.

The first hinge bracket 220 may be connected with the first center bracket 210 and may rotate about a first virtual axis 201_9 by a specified angle in a first rotational direction 201a. The first virtual axis 201_9 may be located at a specified height above the surface of the display 110. The first hinge bracket 220 may include a first plate coupling hole 221a_1 for combination with the first hinge plate 141 described above with reference to FIG. 2.

The second hinge bracket 220_2 may be connected with the second center bracket 210_2 and may rotate about a second virtual axis 202_9 by the specified angle in a second rotational direction 202a. The second virtual axis 202_9 may be located at the specified height above the surface of the display 110. The second virtual axis 202_9 may be formed in a position symmetric to the first virtual axis 201_9 in a diagonal direction with respect to the fixed axis 20. The second hinge bracket 220_2 may include a second plate coupling hole 221a_2 for combination with the second hinge plate 142 described above with reference to FIG. 2. The first plate coupling hole 221a_1 and the second plate coupling hole 221a_2 may be located on or within a specified distance from the virtual alignment line 399 as illustrated in FIG. 3. As such, the hinge brackets 220 and 220_2 may perform rotary motion within a predetermined range from the virtual alignment line 399 while the hinge plates 141 and 142 coupled with the plate coupling holes 221a_1 and 221a_2 and the housing structures 121 and 122 rotate depending on hinge motion. Accordingly, distortion or twisting of the housing structures 121 and 122 and the hinge plates 141 and 142 may be minimized, and damage to the foldable display device 100 may be prevented. In FIG. 3, the plate coupling holes 221a_1 and 221a_2 are illustrated as being spaced apart from the virtual alignment line 399 by a predetermined distance. However, the plate coupling holes 221a_1 and 221a_2 may be located on the virtual alignment line 399.

When the first housing structure 121 and the second housing structure 122 are in a flat state, one side of the first hinge bracket 220 and one side of the second hinge bracket 220_2 may face each other, or at least a portion of the first hinge bracket 220 and at least a portion of the second hinge bracket 220_2 may be adjacent to, or brought into contact with, each other. When the first housing structure 121 and the second housing structure 122 are in a folded state, the first hinge bracket 220 and the second hinge bracket 2202 may rotate in the first rotational direction 201a and the second rotational direction 202a, respectively, and may be spaced apart from each other at a specified interval.

Figure 4:
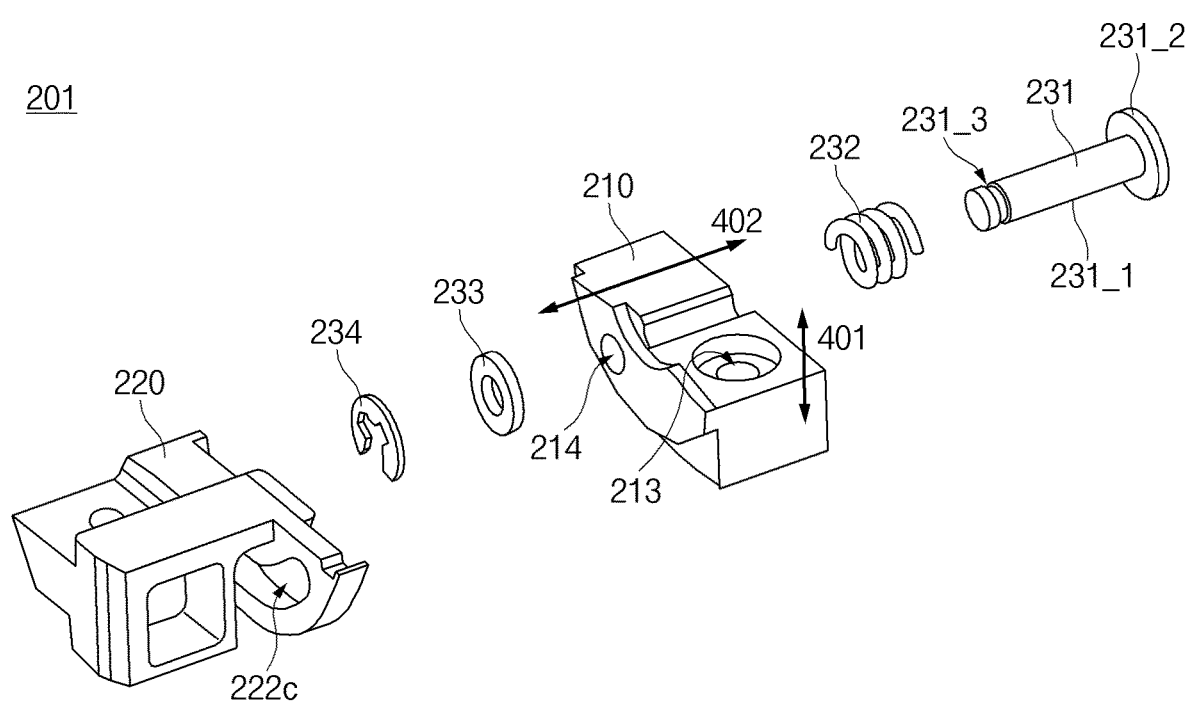
FIG. 4 is an exploded perspective view of a first sub-hinge structure according to an embodiment.

FIG. 4 is an exploded perspective view of the first sub-hinge structure according to an embodiment.

Referring to FIG. 4, the first sub-hinge structure 201 may be the same structure as the first sub-hinge structure 201 or the second sub-hinge structure 202 described above with reference to FIG. 3.

The first sub-hinge structure 201 may include the first center bracket 210, the first hinge bracket 220, a connecting shaft 231, an elastic member 232, a washer ring 233, and a fixing member 234.

The first center bracket 210 may be fixed to the hinge housing 150, and the first hinge bracket 220 may be fastened to one side of the first center bracket 210. At least a portion of the first center bracket 210 may be formed to be similar to at least a portion of the shape of an inner surface of the hinge housing 150 such that the first center bracket 210 is mounted in and fixed to the hinge housing 150. The first center bracket 210 may include a fixing hole 213 such that the first center bracket 210 is fixed to the hinge housing 150. The first center bracket 210 may include, on a side thereof, a shaft insertion hole 214 into which the connecting shaft 231 is inserted. The fixing hole 213 may be formed in a first axial direction 401 (or the direction toward the ground in FIG. 4) in which the first center bracket 210 is mounted in the hinge housing 150. The shaft insertion hole 214 may be formed in a second axial direction 402 (or the horizontal direction in FIG. 4) such that the first hinge bracket 220 is connected to one side of the first center bracket 210. The shaft insertion hole 214 may be formed by connecting two holes with different diameters such that the elastic member 232 is disposed in the shaft insertion hole 214 and the connecting shaft 231 protrudes in the direction toward the first hinge bracket 220 (or in the second axial direction 402). The first axial direction 401 of the fixing hole 213 and the second axial direction 402 of the shaft insertion hole 214 may be perpendicular to each other. At least a portion of the first center bracket 210 may be formed of a metallic material to maintain at least a specified stiffness. At least a portion of the fixing hole 213 may be formed of a metallic material or a reinforced plastic material to maintain at least a specified coupling force between the first center bracket 210 and the hinge housing 150.

The first hinge bracket 220 may include a body to which one of the hinge plates 141 and 142 described above with reference to FIG. 2 is coupled. The first hinge bracket 220 may be fastened to the first center bracket 210 and may perform hinge motion relative to the first center bracket 210 in the first rotational direction 201a or the second rotational direction 202a. In this regard, the first hinge bracket 220 may have a shaft connecting hole 222c into which one side of the connecting shaft 231 is inserted.

The connecting shaft 231 may include a shaft body 231_1 in a cylindrical shape with a specified length, a head 231_2 that is disposed at one end of the shaft body 231_1 and that has a larger cross-sectional area than the shaft body 231_1, and a band-shaped ring groove 231_3 formed on an opposite end portion of the shaft body 231_1 by removing at least a portion of the surface of the shaft body 231_1. The shaft body 231_1 may have a smaller cross-sectional area than the shaft insertion hole 214 such that the connecting shaft 231 is inserted into the shaft insertion hole 214. The shaft body 231_1 may have a length corresponding to the sum of the thickness of one side of the first center bracket 210 and the thickness of a portion of the first hinge bracket 220, such that the fixing member 234 and the washer ring 233 are mounted on the shaft body 231_1 after the shaft body 231_1 is inserted into the shaft insertion hole 214 and passes through the shaft connecting hole 222c. The head 231_2 may be formed to be larger than the shaft insertion hole 214 to prevent the connecting shaft 231 from being separated from the shaft insertion hole 214. The ring groove 231_3 may have a width corresponding to the width of the fixing member 234 or a width smaller than the width of the fixing member 234 by a specified size such that the fixing member 234 is fixedly inserted into the ring groove 231_3.

The elastic member 232 may include a coil spring in a coil shape. After being mounted on the connecting shaft 231, the elastic member 232 may be inserted into the shaft insertion hole 214 when the connecting shaft 231 is inserted into the shaft insertion hole 214 of the first center bracket 210. The diameter of the shaft insertion hole 214 varies in a manner to accommodate the elastic member 232, as will be described below in detail in FIG. 7. The elastic member 232 may be disposed in the shaft insertion hole 214 in a compressed state and may be fixed by the fixing member 234, and the elastic force by the compression may cause a frictional force between the first hinge bracket 220 and the first center bracket 210. Accordingly, the first sub-hinge structure 201 (or the second sub-hinge structure 202) may generate torque between hinge motions.

The washer ring 233 may be mounted on one end portion of the connecting shaft 231 (e.g., the opposite end portion of the shaft body 231_1 on the opposite side to the head 231_2) that passes through the shaft insertion hole 214 of the first center bracket 210. The inner diameter of the washer ring 233 may be larger than the diameter of the shaft body 231_1 of the connecting shaft 231. The washer ring 233, after mounted on the shaft body 231_1, may be disposed to be brought into contact with an inner peripheral portion of the shaft connecting hole 222c of the first hinge bracket 220. For example, the washer ring 233 may be disposed between the fixing member 234 fixed to the ring groove 231_3 of the connecting shaft 231 and the shaft insertion hole 214. The washer ring 233 may generate a frictional force while the first hinge bracket 220 rotates relative to the first center bracket 210 in the first rotational direction 201a or the second rotational direction 202a, and may allow the first hinge bracket 220 to more smoothly rotate along one surface of the first center bracket 210. The outer diameter of the washer ring 233 may be larger than the minor diameter of the shaft connecting hole 222c, and the washer ring 233 may support the connecting shaft 231 to prevent the connecting shaft 231 from being separated from the shaft connecting hole 222c.

The fixing member 234 may be inserted into the ring groove 231_3 formed on the connecting shaft 231. The opposite end portion of the shaft body 231_1 of the connecting shaft 231 that passes through the shaft insertion hole 214 of the first center bracket 210 and on which the ring groove 231_3 is formed may pass through the shaft connecting hole 222c of the first hinge bracket 220 and may be located inward of the structure that forms the shaft connecting hole 222c. The washer ring 233 may be mounted on the opposite end portion of the shaft body 231_1 that is located inward of the shaft connecting hole 222c, and the fixing member 234 may be fixedly inserted into the ring groove 231_3 formed on the opposite end portion of the shaft body 231_1. In this regard, the fixing member 234 may include an E-ring (or a horseshoe-shaped ring) that is open at one side. The diameter of the inner hole of the fixing member 234 may be smaller than the diameter of the shaft body 231_1, and the fixing member 234 may be fixedly inserted into the ring groove 231_3. The outer diameter of the fixing member 234 may be larger than the diameter of the shaft body 231_1, and the fixing member 234 may support the washer ring 233 to prevent the washer ring 233 from being separated from the shaft body 231_1. The width of the fixing member 234 may be the same as, or smaller than, the width of the ring groove 231_3.

Figure 5A:
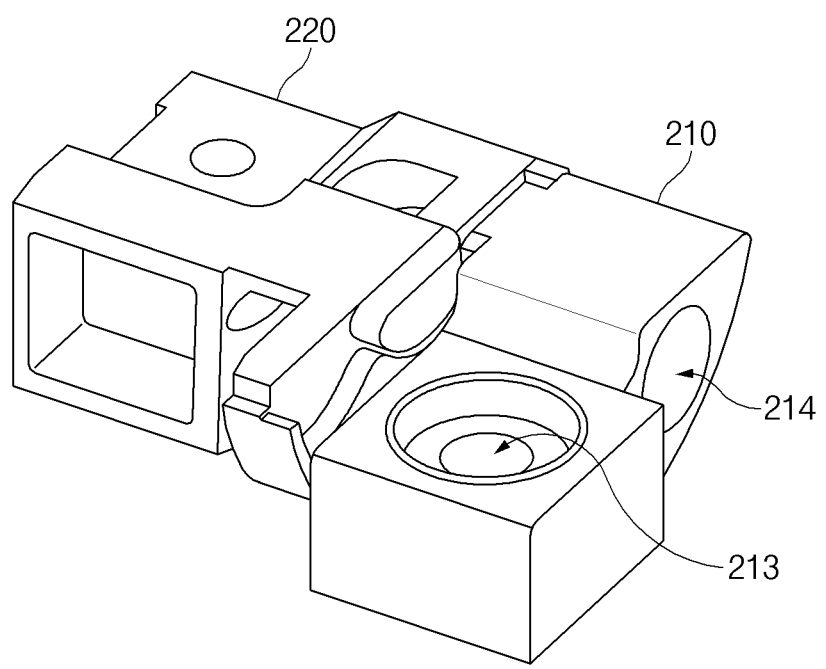
FIG. 5A illustrates a center bracket and a hinge bracket of the first sub-hinge structure according to an embodiment.
Figure 5B:
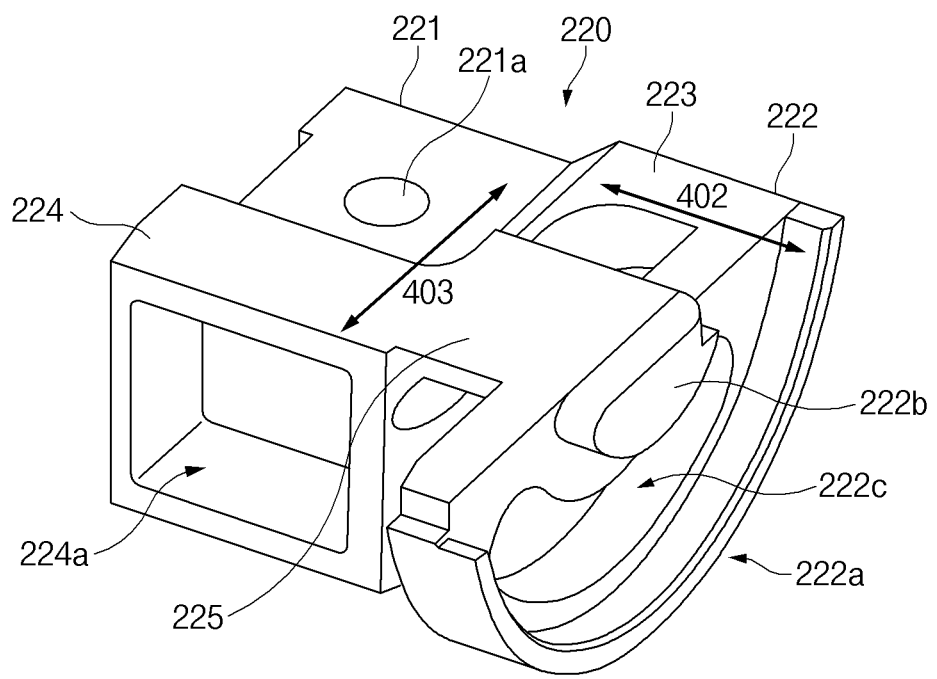
FIG. 5B illustrates the center bracket according to an embodiment.
Figure 5C:
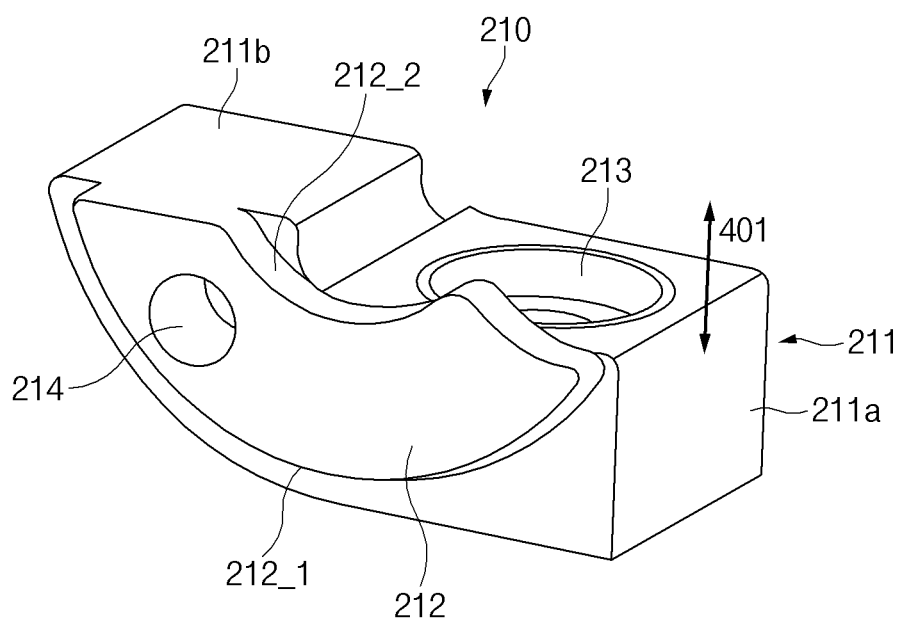
FIG. 5C illustrates the hinge bracket according to an embodiment.
Figure 6A:
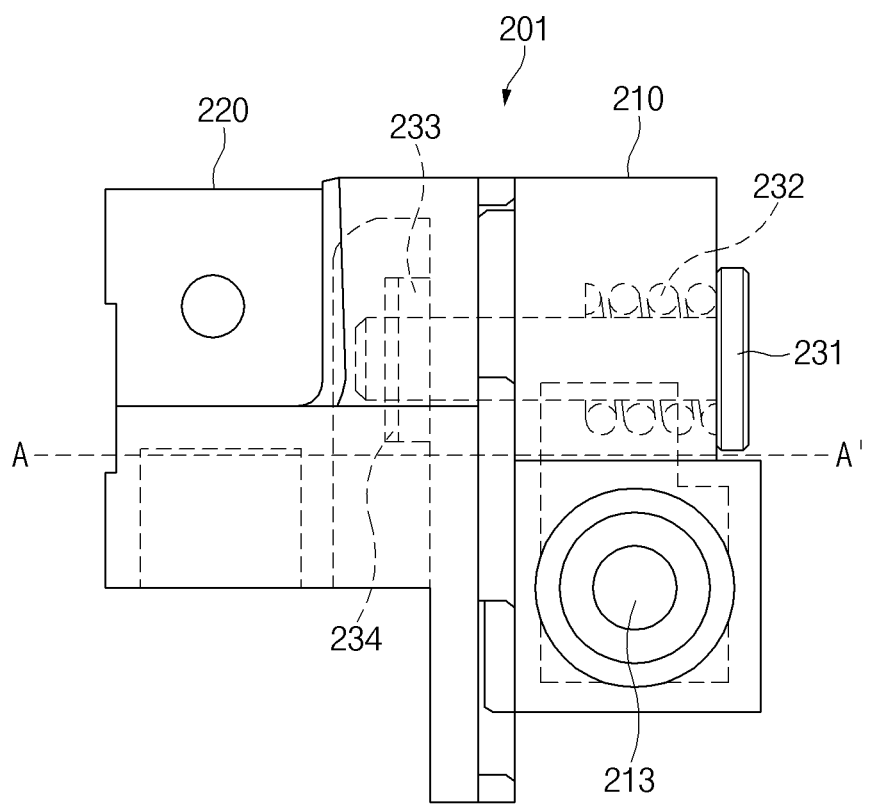
FIG. 6A illustrates one surface of the first sub-hinge structure according to an embodiment.
Figure 6B:
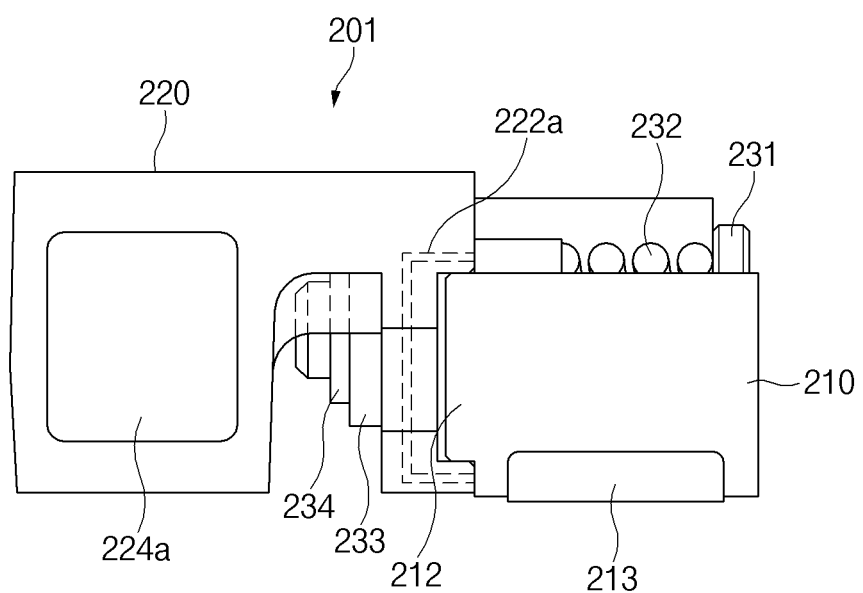
FIG. 6B is a sectional view taken along line A-A' of FIG. 6A.

FIG. 5A illustrates the center bracket and the hinge bracket of the first sub-hinge structure according to an embodiment, FIG. 5B illustrates the center bracket according to an embodiment, FIG. 5C illustrates the hinge bracket according to an embodiment, FIG. 6A illustrates one surface of the first sub-hinge structure according to an embodiment, and FIG. 6B is a sectional view taken along line A-A' of FIG. 6A.

Referring to FIGS. 5A, 5B, 5C, 6A and 6B, the first center bracket 210 may include a body 211, a protrusion 212 formed on one side of the body 211, and the fixing hole 213 into which a coupling member for fixing the first center bracket 210 to the hinge housing 150 is inserted. The body 211 may include a fixed body 211a into which is formed the fixing hole 213 and that is fixed to the hinge housing 150 and a connecting body 211b into which the connecting shaft 231 connected with the first hinge bracket 220 is fixedly inserted.

The protrusion 212 may include a first rail 212_1 formed on one side and may protrude from the surface of the body 211 that faces the first hinge bracket 220 by a specified height in the second axial direction 402 in which the first hinge bracket 220 is connected to the first center bracket 210. The first rail 212_1 may be convexly formed in the first axial direction 401 in which the coupling member is inserted into the fixing hole 213. The protrusion 212 may include a first rail support portion 212_2 formed on an opposite side of the protrusion 212. The first rail support portion 212_2 may protrude to a predetermined height above the body 211 (e.g., in the opposite direction to the direction in which the coupling member is inserted into the fixing hole 213) and may have a central portion with a predetermined curvature. The first rail support portion 212_2 may be convexly formed in the direction in which the coupling member is inserted into the fixing hole 213 (or, in the same direction as the direction in which the first rail 212_1 is convex or in the first axial direction 401).

The fixed body 211a may include the fixing hole 213 and may have an overall hexahedral shape that may be mounted on the inside of the hinge housing 150. The fixed body 211a may be fixed to the inside of the hinge housing 150 while the coupling member (e.g., a screw) is inserted into the fixing hole 213 and coupled to the hinge housing 150. On one side of the fixing member 234, at least a portion of the protrusion 212 may be formed to have a predetermined height. A peripheral portion that forms the fixing hole 213 may be formed of the same metallic material as that of the fixed body 211a, or may be formed of a plastic or polymer material that is different from the metallic portion of the fixed body 211a.

The connecting body 211b may extend from one surface of the fixed body 211a. The connecting body 211b may be mounted on the inside of the hinge housing 150 and may be formed to have a specified curvature along the inner wall of the hinge housing 150 that has a predetermined curvature. For example, the connecting body 211b may have a cross-section in an arc shape with a predetermined size. On one side of the connecting body 211b, the remaining portion of the protrusion 212 may be formed to have a predetermined height. The shaft insertion hole 214 may be formed in the connecting body 211b. The inlet and the outlet of the shaft insertion hole 214 may have different diameters. Because the shaft insertion hole 214 is formed in the connecting body 211b, the axis of rotation of the first hinge bracket 220 connected to the first center bracket 210 through the connecting shaft 231 inserted into the shaft insertion hole 214 may be formed as a virtual axis at a specified height above the upper surface of the body 211. The elastic member 232 mounted on the connecting shaft 231 may be inserted into the shaft insertion hole 214 and may have a larger diameter than the outlet of the shaft insertion hole 214. Accordingly, the elastic member 232 may be disposed so as not to be separated toward the outlet of the shaft insertion hole 214.

The first hinge bracket 220 may include a base body 221 that is coupled with one of the hinge plates 141 and 142, a plate coupling hole 221a formed in the first hinge bracket 220, an extending body 224 extending from one surface of the base body 221 and facing another hinge bracket in a flat state of the foldable display device 100, a rotary body 222 formed in a position spaced apart from the base body 221 and the extending body 224 at a predetermined interval, a first bridge 223 connecting the base body 221 and the rotary body 222, and a second bridge 225 connecting the extending body 224 and the rotary body 222.

The base body 221 may have a hexahedral shape and may include a plate coupling hole 221a formed in the upper surface thereof in the first axial direction 401. The base body 221 may be spaced apart from the rotary body 222 by a predetermined distance in the second axial direction 402 and may extend in a third axial direction 403 with the extending body 224. The base body 221 may transmit a force to the hinge plate coupled to the base body 221 while the first hinge bracket 220 rotates in the first rotational direction 201a or the second rotational direction 202a.

The extending body 224 may extend from the base body 221 in the third axial direction 403 to have a predetermined thickness. The upper surface of the extending body 224 may be in a higher position than the upper surface of the base body 221 by a specified height. Accordingly, the extending body 224 may serve to support the hinge plate coupled to the base body 221 so as to prevent the hinge plate from being pushed in one direction. The extending body 224 may have a mounting portion 224a formed to a predetermined depth on the central portion of the surface that faces the third axial direction 403 among the surfaces of the extending body 224. The mounting portion 224a may be provided in various shapes depending on the external shape of an object that is mounted in the mounting portion 224a. A magnetic member or a magnetic material attracted by the magnetic force of the magnetic member may be mounted in the mounting portion 224a. An adhesive may be applied to an inner surface of the mounting portion 224a to fix the magnetic member or the magnetic material. Alternatively, an adhesive layer may be formed between the inner surface of the mounting portion 224a and the magnetic member or the magnetic material.

The rotary body 222 may guide the first hinge bracket 220 such that the first hinge bracket 220 is rotatable within a specified angle range along the protrusion 212 of the first center bracket 210. In this regard, the rotary body 222 may include a second rail support portion 222a on which the first rail 212_1 of the protrusion 212 is mounted and that rotates along the first rail 212_1 while the first hinge bracket 220 rotates and a second rail 222b that is mounted on the first rail support portion 212_2 of the protrusion 212 and that rotates in cooperation with the first rail support portion 212_2 while the first hinge bracket 220 rotates.

The second rail support portion 222a may protrude from a bottom surface by a predetermined height and may have a sidewall shape with a predetermined curvature. The second rail 222b may protrude from the bottom surface by a predetermined height and may have a semicircular (or at least partially semi-elliptical) protrusion shape in which one surface protrudes with a predetermined curvature. The shaft connecting hole 222c may be located on the bottom surface between the second rail 222b and the second rail support portion 222a. The shaft connecting hole 222c may be provided in the shape of a portion of a band that is bent with a curvature similar to the curvature of the second rail support portion 222a. A portion of the connecting shaft 231 may be mounted in the shaft connecting hole 222c, and the one end portion of the connecting shaft 231 may pass through the shaft connecting hole 222c and may be located between the base body 221 and the rotary body 222.

The first bridge 223 may connect an upper edge of the base body 221 and an edge of the rotary body 222 to form a predetermined width between the base body 221 and the rotary body 222. In this regard, the first bridge 223 may be formed to have a predetermined length in the second axial direction 402. The length of the first bridge 223 may be greater than the sum of the thickness of the washer ring 233 and the thickness of the fixing member 234.

The second bridge 225 may connect one side of the extending body 224 and one side of the rotary body 222. In this regard, the second bridge 225 may have a length s similar to the length of the first bridge 223 in the same direction. The second bridge 225, together with the first bridge 223, may firmly fix the rotary body 222 to the base body 221 and the extending body 224.

The first bridge 223 and the second bridge 225 may be integrated with each other as illustrated in FIG. 5B. In this case, the integrated bridge may connect an upper side of the base body 221 and an upper side of the extending body 224 with an upper side of the rotary body 222.

Figure 7:
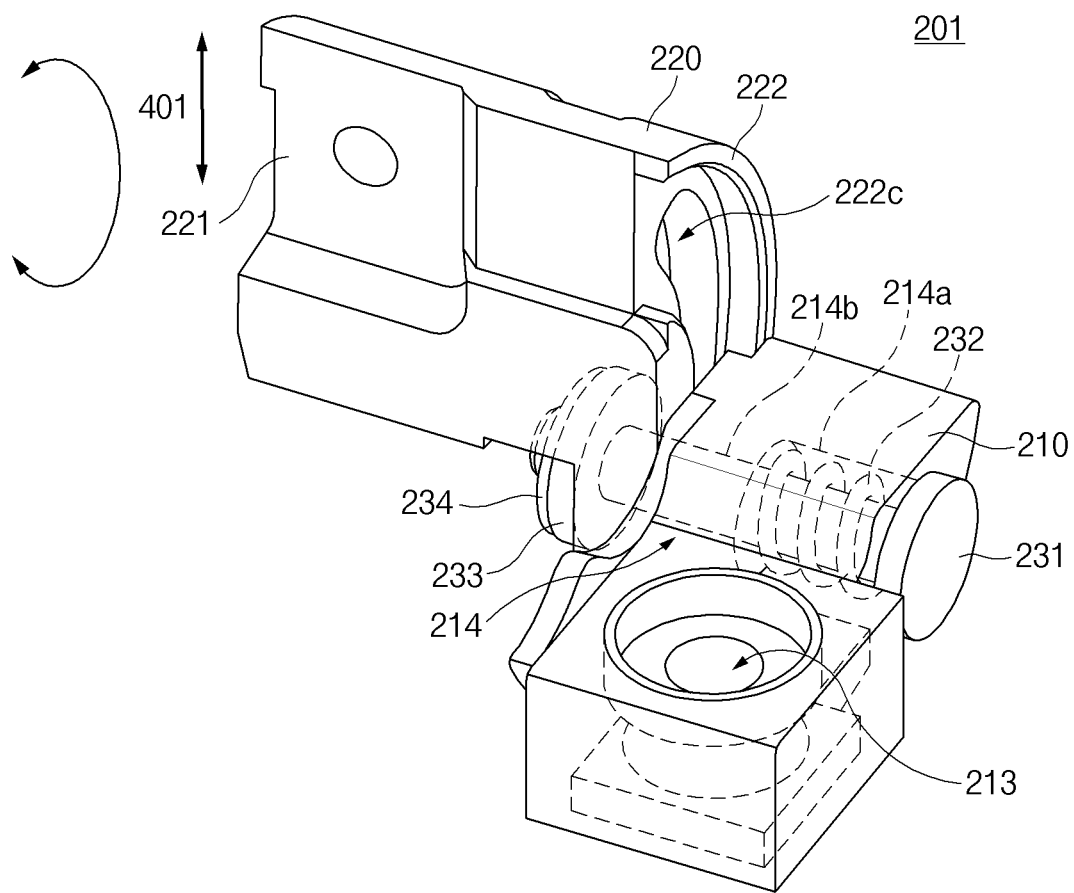
FIG. 7 illustrates hinge motion of the first sub-hinge structure according to an embodiment.

FIG. 7 illustrates hinge motion of the first sub-hinge structure according to an embodiment.

Referring to FIG. 7, as described above, the first sub-hinge structure 201 (or the second sub-hinge structure 202) may include the first center bracket 210, the first hinge bracket 220, the connecting shaft 231, the elastic member 232, the washer ring 233, and the fixing member 234. The first center bracket 210 may be fixed to the hinge housing 150 by using the fixing hole 213. The first center bracket 210 may have the shaft insertion hole 214 formed through the first center bracket 210 in the second axial direction 402, and the connecting shaft 231 may be inserted into the shaft insertion hole 214.

As noted above in reference to FIG. 4, an inlet hole 214a and an outlet hole 214b of the shaft insertion hole 214 may have different diameters. For example, the diameter of the inlet hole 214a may be larger than the diameter of the outlet hole 214b. The elastic member 232 may be located in the inlet hole 214a, a portion of the connecting shaft 231 that passes through the elastic member 232 may pass through the shaft connecting hole 222c of the first hinge bracket 220 via the outlet hole 214b, and the fixing member 234 may be mounted on the one end portion of the connecting shaft 231. The washer ring 233 may be disposed between the fixing member 234 and the rotary body 222 of the first hinge bracket 220. The washer ring 233 may generate a frictional force between the first hinge bracket 220 and the fixing member 234 and may support rotation of the first hinge bracket 220. However, the washer ring 233 may be omitted, in which case the fixing member 234 may be disposed to make direct contact with the inside of the rotary body 222. The elastic member 232 may also be omitted, in which case the shaft insertion hole 214, into which the connecting shaft 231 is inserted, may be formed such that the inlet and the outlet have the same diameter. Alternatively, a washer ring may be disposed between the connecting shaft 231 and the inlet of the shaft insertion hole 214. The surrounding area of the inlet of the shaft insertion hole 214 may be formed to be larger than the shaft insertion hole 214 by a specified size such that the head 231_2 of the connecting shaft 231 is seated on the surrounding area. A recess in which the head 231_2 is mounted may be formed to a predetermined depth in the surrounding area of the inlet of the shaft insertion hole 214.

While the first hinge bracket 220 performs hinge motion, the position of the connecting shaft 231 in the shaft connecting hole 222c may be changed. That is, while the hinge plate coupled to the first hinge bracket 220 and the housing structure to which the hinge plate is coupled are rotated by external pressure in a specified direction, the first hinge bracket 220 may perform rotary motion, with a change in the position of the connecting shaft 231 in the shaft connecting hole 222c. The angle through which the first hinge bracket 220 is able to rotate may be determined by the form of the shaft connecting hole 222c. The first hinge bracket 220 may rotate from the angle at which the upper surface of the base body 221 is perpendicular to the first axial direction 401 to the angle at which the upper surface of the base body 221 is parallel to the first axial direction 401 (e.g., 90 degrees to 0 degrees). The first hinge bracket 220 may rotate to an angle (e.g., −10 degrees to 100 degrees) that further includes an angle specified depending on at least one of the shape of the shaft connecting hole 222c and surrounding structures such as a first center bracket 210 or the shaft connecting shaft 220.

Figure 8A:
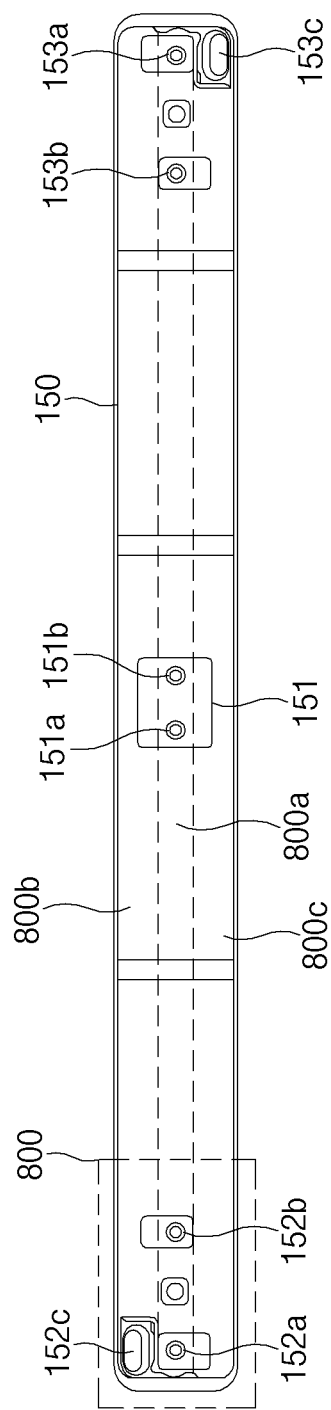
FIG. 8A illustrates one surface of a hinge housing according to an embodiment.
Figure 8B:
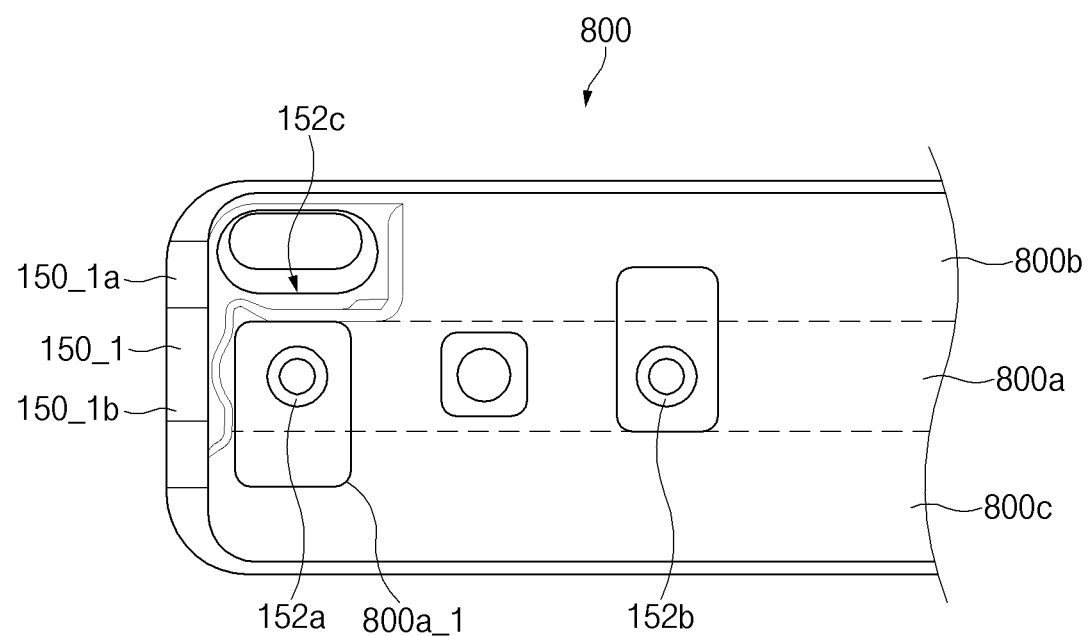
FIG. 8B is a detailed view of area "800" in FIG. 8A.
Figure 8C:
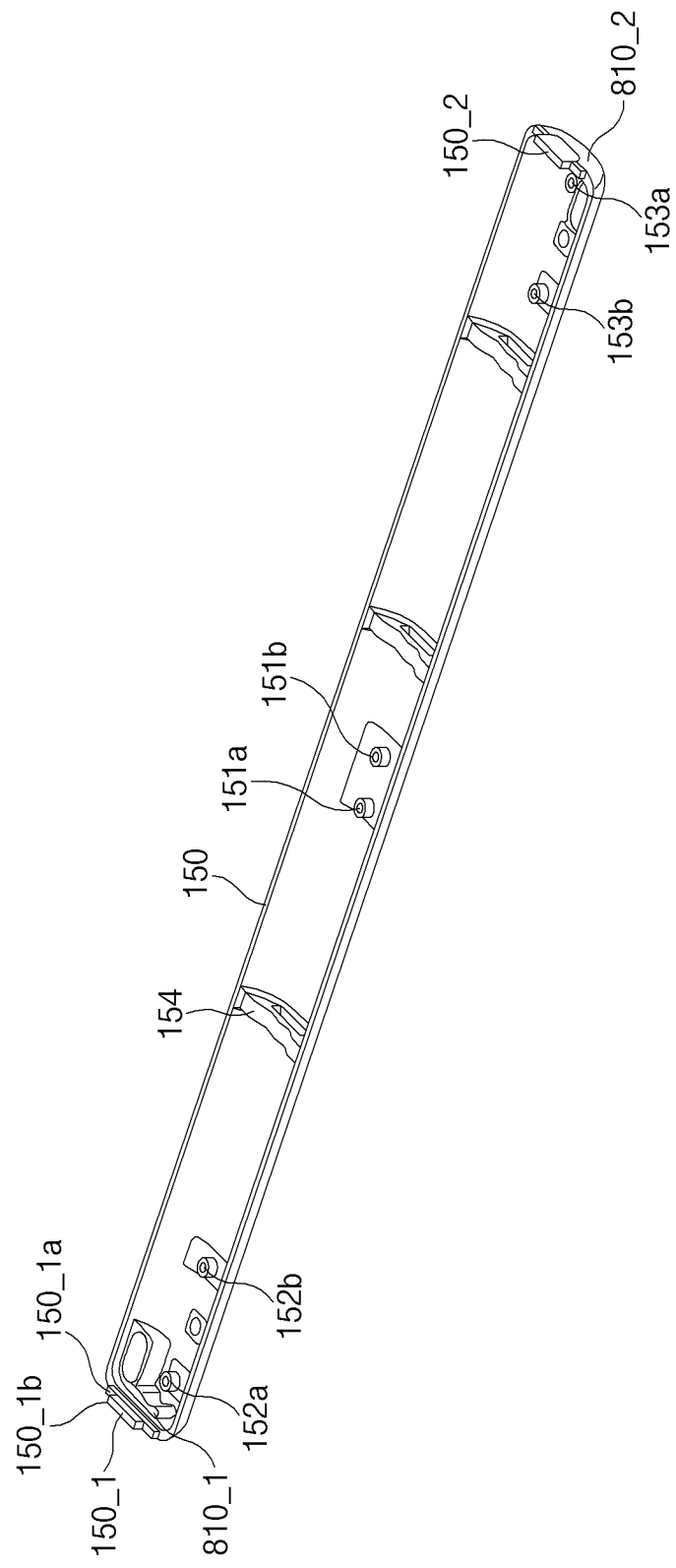
FIG. 8C is a perspective view of the hinge housing according to an embodiment.

FIG. 8A illustrates one surface of the hinge housing according to an embodiment, FIG. 8B is a detailed view of area "800" in FIG. 8A, and FIG. 8C is a perspective view of the hinge housing according to an embodiment.

Referring to FIGS. 8A, 8B and 8C, the hinge housing 150 may be disposed between the first housing structure 121 and the second housing structure 122 of the foldable display device 100 of FIG. 1. The hinge housing 150 may have a semi-cylindrical (or at least partially semi-elliptical) shape having an empty space inside. The hinge housing 150 may include a central portion 800a that has a specified width and that is formed to be flat, and opposite lateral portions 800b and 800b located on opposite sides of the central portion 800a and bent with a predetermined curvature. The hinge housing 150 may include, on the inside thereof, a central area 151 on which the third hinge structure 300 is fixedly mounted and opposite edge areas on which the first hinge structure 200a and the second hinge structure 200b are fixedly mounted. Bosses 151a and 151b (or protrusions) for fixing the third hinge structure 300 may be disposed on the central area 151 on which the third hinge structure 300 is fixedly mounted.

The hinge structures 200a and 200b described above may be fixedly mounted on the inside of the hinge housing 150. In this regard, the hinge housing 150 may include a first sub-boss 152a and a second sub-boss 152b that are disposed on one edge area of the central portion 800a to fixedly mount the first hinge structure 200a, and a third sub-boss 153a and a fourth sub-boss 153b that are disposed on an opposite edge area of the central portion 800a to fixedly mount the second hinge structure 200b. The first sub-boss 152a and the second sub-boss 152b, and the third sub-boss 153a and the fourth sub-boss 153b may be disposed on the opposite edge areas with respect to the central area 151, on which the third hinge structure 300 is mounted, so as to be symmetric to each other.

The sub-hinge structure of the first hinge structure 200a that rotates in the second rotational direction 202a may be fixed to the first sub-boss 152a, and the sub-hinge structure of the first hinge structure 200a that rotates in the first rotational direction 201a may be fixed to the second sub-boss 152b. The sub-hinge structure of the second hinge structure 200b that rotates in the first rotational direction 201a may be fixed to the third sub-boss 153a, and the sub-hinge structure of the second hinge structure 200b that rotates in the second rotational direction 202a may be fixed to the fourth sub-boss 153b.

The hinge housing 150 may include hinge supports 152c and 153c disposed at opposite edges to support the hinge structures mounted on the hinge housing 150. The hinge supports 152c and 153c may include the first hinge support 152c that is located at the left edge of the hinge housing 150 in FIGS. 8A and 8C and that supports the sub-hinge structure coupled to the first sub-boss 152a and the second hinge support 153c that is located at the right edge of the hinge housing 150 in FIGS. 8A and 8C and that supports the sub-hinge structure coupled to the fourth sub-boss 153b. The hinge supports 152c and 153c may be formed by deforming at least parts of the lateral portions 800b and 800c, or by sidewalls protruding from the insides of the lateral portions 800b and 800c by a specified height. The hinge supports 152c and 153c may be formed of the same material as that of the central portion 800a of the hinge housing 150. Alternatively, the hinge supports 152c and 153c may be implemented with separate additional structures provided at positions spaced apart from the sub-bosses at predetermined intervals.

The hinge housing 150 may include printed patterns 800a_1 to guide the directions in which the hinge structures are inserted. The printed patterns 800a_1 may be disposed around the coupling members or the sub-bosses and may be engraved on the inside of the hinge housing 150. The printed patterns 800a_1 may include the sub-bosses disposed on the central portion 800a and include predetermined areas of the central portion 800a and partial areas of the first lateral portion 800b or the second lateral portion 800c.

The hinge housing 150 may further include covers 810_1 and 810_2 that at least partially close the opposite edges of the hinge housing 150. The covers 810_1 and 810_2 may have a shape corresponding to the cross-sectional shape of the hinge housing 150. Screens 150_1 and 150_2 protruding from the upper surfaces of the opposite lateral portions 800b and 800c by a specified height may be disposed at upper ends of the covers 810_1 and 810_2. The screens 150_1 and 150_2 may include the first screen 150_1 formed at the left edge and the second screen 150_2 formed at the right edge with respect to the illustrated drawing. The screens 150_1 and 150_2 may include first steps 150_1a extending from the upper surfaces of the covers 810_1 and 810_2 and having a first width and area and second steps 150_1b extending from the first steps 150_1a and having a second width smaller than the first width. When the foldable display device 100 is in a folded state, the screens 150_1 and 150_2 may serve to hide the central portion of the folded display 110 such that the central portion of the folded display is not exposed to the outside. Furthermore, the screens 150_1 and 150_2 may prevent infiltration of foreign matter between the folded display 110 and the housing structures 121 and 122. With regard to bend prevention, the hinge housing 150 may further include, on at least a partial area of the inside thereof, supports 154 that support the central portion 800a and the opposite lateral portions 800b and 800c.

Figure 9A:
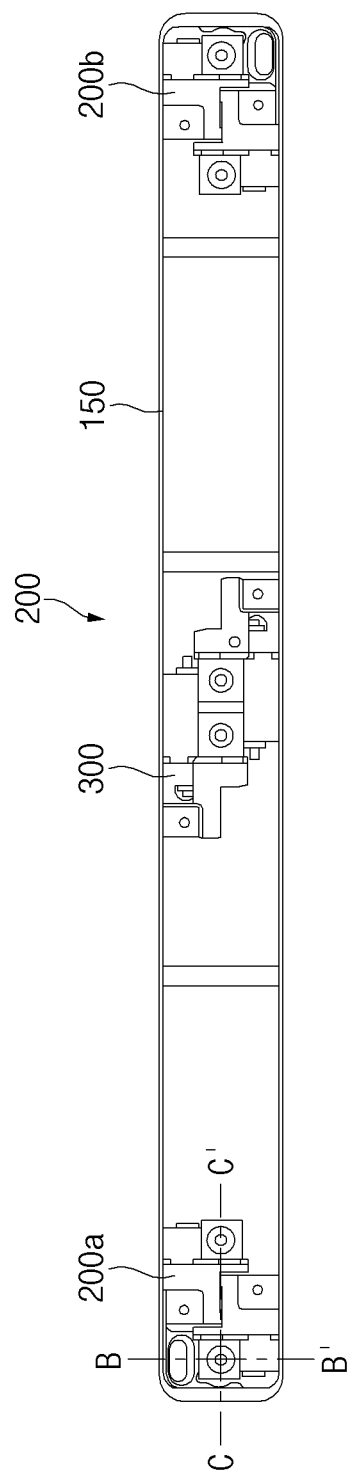
FIG. 9A illustrates one surface of a hinge module according to an embodiment.
Figure 9B:
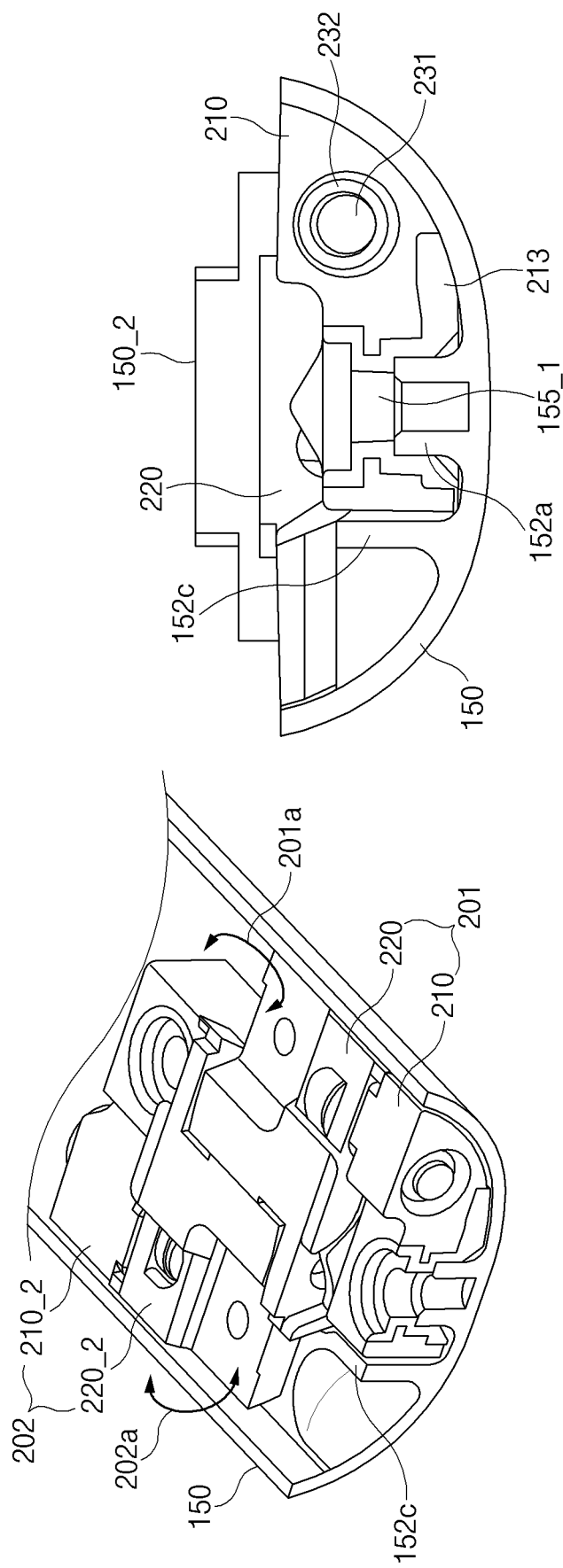
FIG. 9B illustrates a sectional perspective view and a sectional view taken along line B-B' of FIG. 9A.
Figure 9C:
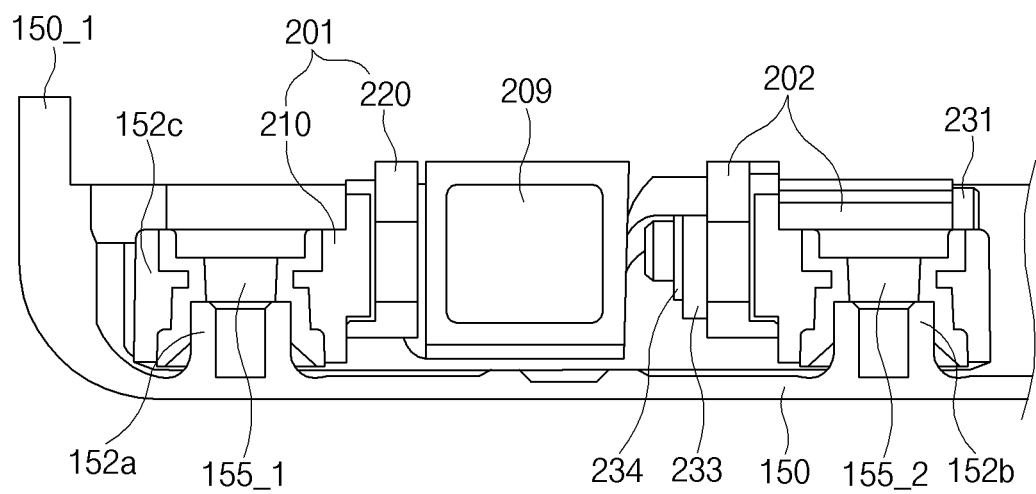
FIG. 9C is a sectional view taken along line C-C' of FIG. 9A.

FIG. 9A illustrates one surface of the hinge module according to an embodiment, FIG. 9B illustrates a sectional perspective view and a sectional view taken along line B-B' of FIG. 9A, and FIG. 9C is a sectional view taken along line C-C' of FIG. 9A.

Referring to FIGS. 9A, 9B and 9C, the hinge module 200 may include the hinge housing 150, the first hinge structure 200a, the second hinge structure 200b, and the third hinge structure 300. The first hinge structure 200a may be disposed on the left edge area of the hinge housing 150. The second hinge structure 200b may be disposed on the right edge area of the hinge housing 150. The third hinge structure 300 may be disposed on the central area of the hinge housing 150, or on one side of the hinge housing 150 in a specified position between the first hinge structure 200a and the second hinge structure 200b. The first hinge structure 200a and the second hinge structure 200b may be formed in the same structure. For example, each of the first hinge structure 200a and the second hinge structure 200b may include a pair of sub-hinge structures disposed to alternate with each other and coupled to different housing structures through different hinge plates without being interlocked with each other. The third hinge structure 300 may have a structure in which parts coupled to the different hinge plates are interlocked with each other.

As described above, each of the first hinge structure 200a and the second hinge structure 200b may include a center bracket, a hinge bracket, and a connecting shaft 231 that fixes the hinge bracket to the center bracket and performs rotary motion within a predetermined angle range. The first hinge structure 200a disposed on the left edge area of the hinge housing 150 may include the first sub-hinge structure 201 and the second sub-hinge structure 202.

The first sub-hinge structure 201 may include the first center bracket 210, the first hinge bracket 220, the connecting shaft 231 that connects the first center bracket 210 and the first hinge bracket 220, and the elastic member 232 that provides an elastic force during hinge motion of the first hinge bracket 220. The first sub-hinge structure 201 may further include at least one of the fixing member 234 disposed on one side of the connecting shaft 231 to prevent the first hinge bracket 220 from being separated from the first center bracket 210 and the washer ring 233 disposed between the fixing member 234 and one side of the first hinge bracket 220 to generate a frictional force during the hinge motion of the first hinge bracket 220. One side of the first center bracket 210 may be mounted on the hinge housing 150 while making contact with the first hinge support 152c. The first hinge bracket 220 may be connected to the first center bracket 210 and may perform rotary motion within a specified angle range in the first rotational direction 201a while at least a portion of the first hinge bracket 220 makes surface-to-surface contact with the first center bracket 210 (or while the rails and the rail support portions make contact with each other).

The second sub-hinge structure 202 may include the second center bracket 210_2 and the second hinge bracket 220_2. Similar to the first sub-hinge structure 201, the second sub-hinge structure 202 may include at least one of the connecting shaft, the elastic member, the fixing member, and the wash ring. The second center bracket 210_2 may be disposed in the hinge housing 150 so as to be spaced apart from the first hinge bracket 220 by a predetermined distance. The second hinge bracket 220_2 may be disposed adjacent to the first hinge bracket 220 and may be connected to the second center bracket 210_2. The second hinge bracket 220_2 may perform rotary motion within the specified angle range in the second rotational direction 202a while at least partially making surface-to-surface contact with the second center bracket 210_2. The first hinge bracket 220 and the second hinge bracket 220_2 may rotate in different directions while the foldable display device is folded or unfolded. A magnetic material or a magnetic member 209 may be fixedly disposed on the surface of the second hinge bracket 220_2 that faces the first hinge bracket 220. When the hinge brackets 220 and 220_2 become closer to each other within a predetermined distance, the magnetic material or the magnetic member 209 may apply an attraction force to enable the first hinge bracket 220 and the second hinge bracket 220_2 to make contact with each other even though additional pressure is applied by the magnetic force.

The magnetic material or the magnetic member 209 may apply an attraction force with a predetermined magnitude or more to maintain contact between the hinge brackets 220 and 220_2 such that an unintended folded state does not occur. The mounting portion 224a and the magnetic material or the magnetic member fixed to the mounting portion 224a may be replaced with a different structure. For example, the extending body of the first hinge bracket 220 may include a protrusion in a raised-part, hook, or mushroom shape, and the extending body of the second hinge bracket 220_2 may include at least one recess or hole into which the protrusion in a raised-part, hook, or mushroom shape is inserted. In this case, the protrusion of the extending body of the first hinge bracket 220 and the recess of the extending body of the second hinge bracket 220_2 may be coupled with, or separated from, each other when at least a specified pressure is applied.

The hinge module 200 may include the first sub-boss 152a that is formed on the hinge housing 150 and aligned with and disposed in the fixing hole 213 of the first center bracket 210 and a first coupling member 155_1 that is coupled with the first sub-boss 152a to fix the first sub-hinge structure 201 to the hinge housing 150. The hinge module 200 may include the second sub-boss 152b that is formed on the hinge housing 150 and aligned with and disposed in the fixing hole of the second center bracket 210_2 and a second coupling member 155_2 that is coupled with the second sub-boss 152b to fix the second sub-hinge structure 202 to the hinge housing 150. The screens 150_1 and 150_2 may be disposed at the opposite ends of the hinge housing 150 of the hinge module 200 and formed to be higher than the upper surface of the first center bracket 210 by a predetermined height. When the foldable display device is in a folded state, the screens 150_1 and 150_2 may hide the interior of the hinge module 200 such that the interior of the hinge module 200 is not visible from the outside. Furthermore, the screens 150_1 and 150_2 may prevent infiltration of foreign matter, such as dust or moisture, into the hinge module 200.

Although only the shapes and operations of some structures of the hinge structures have been described above with reference to FIGS. 3 to 9C, the disclosure is not limited thereto. As mentioned above, the hinge structures 200a and 200b and the sub-hinge structures 201 and 202 may have the same or similar forms, structures, and shapes and may be referred to as the first or second structures depending on the arranged form. Accordingly, the forms, shapes, and operations of the respective hinge structures 200a and 200b may be identically applied to other hinge structures or other sub-hinge structures. The configuration applied to the first hinge structure 200a or the first sub-hinge structure 201 may be omitted from the second hinge structure 200b or the second sub-hinge structure 202 as needed. For example, even though the washer ring and the elastic member are applied to the first sub-hinge structure 201, the second sub-hinge structure 202 may not include at least one of the washer ring and the elastic member.

Figure 10:
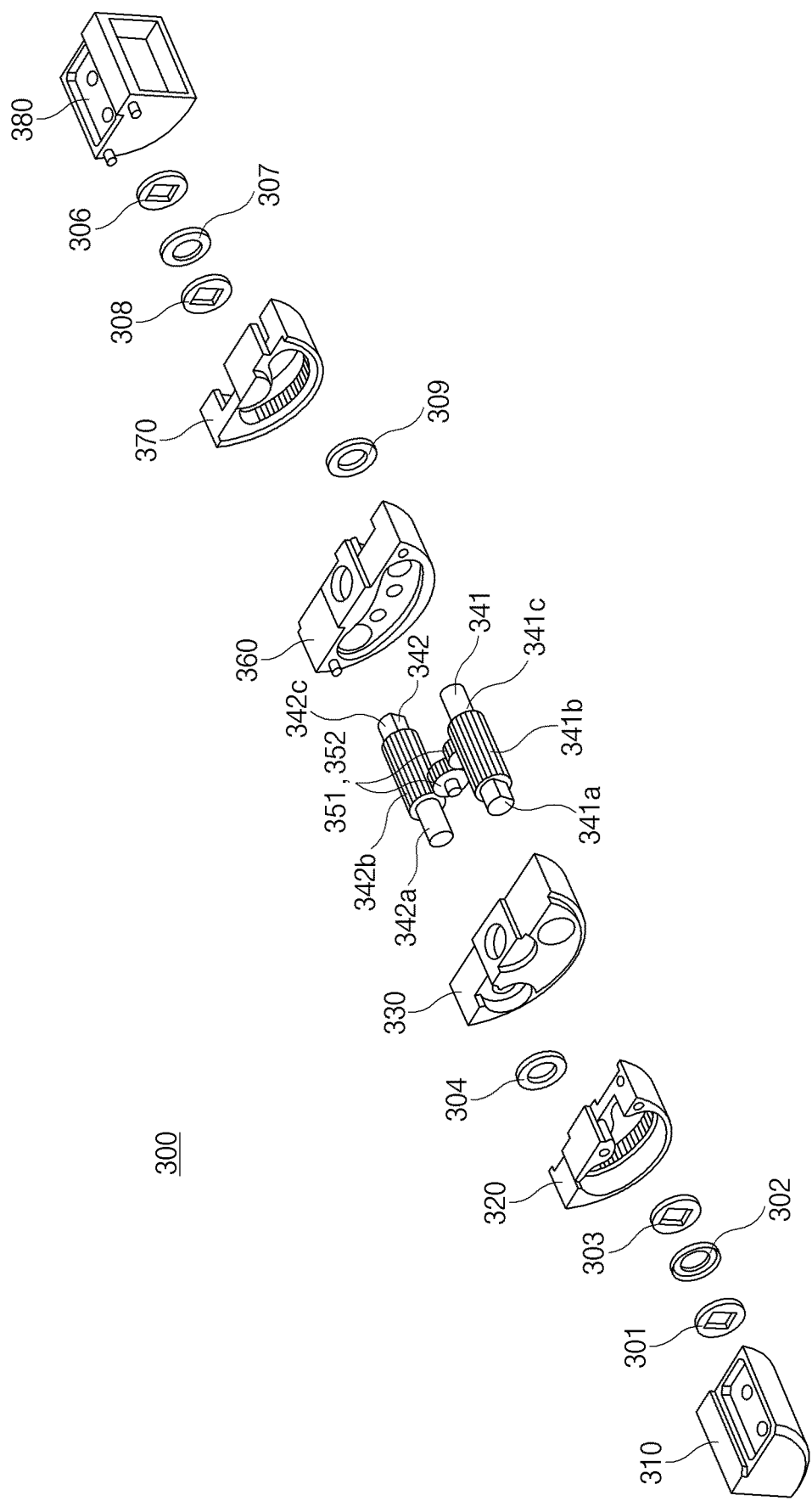
FIG. 10 is an exploded perspective view of a third hinge structure according to an embodiment.

FIG. 10 is an exploded perspective view of the third hinge structure according to an embodiment.

Referring to FIG. 10, the third hinge structure 300 may include a first bracket housing 310, first housing washer rings 301 and 303, a first plate spring 302, a first bracket inner gear 320, a first gear washer ring 304, a first bracket center 330, a first main gear 341 (e.g., a spur gear), a first shaft-gear 351 (e.g., a spur gear), a second shaft-gear 352 (e.g., a spur gear), a second main gear 342 (e.g., a spur gear), a second bracket center 360, a second gear washer ring 309, a second bracket inner gear 370, a second plate spring 307, second housing washer rings 306 and 308, and a second bracket housing 380.

The first bracket housing 310 may be disposed adjacent to the first bracket inner gear 320 and may be fixed to the first bracket inner gear 320. For example, the first bracket housing 310 may have at least one protrusion on a right side portion, and the at least one protrusion may be fixedly inserted into a recess formed on the first bracket inner gear 320. The first bracket housing 310 may have a circular arc shaped cross-section with a predetermined central angle (e.g., a right angle). An upper end of the first bracket housing 310 may be coupled (e.g., screw-coupled) with the second housing structure 122 (or the first housing structure 121). A lateral portion the first bracket housing 310 may be magnet-coupled with the first housing structure 121 (or the second housing structure 122). Accordingly, the first bracket housing 310 may rotate during hinge motion of the second housing structure 122 and may be magnet-coupled with the first housing structure 121 while the first housing structure 121 and the second housing structure 122 are disposed side by side. The first bracket housing 310 may be separated from the first housing structure 121 while the first housing structure 121 and the second housing structure 122 are folded. A curved portion of the first bracket housing 310 may be disposed to face the inside of the hinge housing 150. The first bracket housing 310 may be formed of a metallic material that has a predetermined stiffness. However, the first bracket housing 310 of the disclosure is not limited thereto.

The first housing washer rings 301 and 303 may be disposed between the first bracket housing 310 and the first bracket inner gear 320, and the first plate spring 302 may be disposed between the first housing washer rings 301 and 303. The first housing washer rings 301 and 303 and the first plate spring 302 may be fixed to the first bracket inner gear 320 by rivets. The rivets may be replaced with different fixing members such as nuts or E-shaped rings. The first housing washer rings 301 and 303 and the first plate spring 302 may be mounted in the recess formed on one side of the first bracket inner gear 320. A hole formed through the first bracket inner gear 320 may be provided in the recess. A portion of the first main gear 341 that passes through the first bracket center 330 and the second bracket center 360 may be disposed in the hole.

The first bracket housing 310 may be fixed to a left side of the first bracket inner gear 320, and the first bracket center 330 may be disposed on a right side of the first bracket inner gear 320. The first bracket inner gear 320 may rotate along at least a portion of a side surface of the first bracket center 330, may have a semi-elliptical shape, and may include an internal gear which is engaged with the first main gear 341. The internal gear may be formed in the shape of a semi-elliptical arc. The first bracket inner gear 320 may be formed of a metallic material having a predetermined stiffness. For example, the first bracket inner gear 320 may be formed of the same material as that of the first bracket housing 310. The material of the first bracket inner gear 320 described in embodiments is not limited to the metallic material.

The first gear washer ring 304 may be disposed between the first bracket inner gear 320 and the first bracket center 330. For example, the first gear washer ring 304 may be mounted in a recess (or hole) of the first bracket center 330. One side of the second main gear 342 that passes through the first bracket center 330 and the second bracket center 360 may be inserted into the first gear washer ring 304.

The first bracket center 330 may be disposed between the first bracket inner gear 320 and the second bracket center 360. The first bracket center 330 may have a semi-elliptical shape that is larger in size than the first bracket inner gear 320. The first bracket center 330 may have a hole into which a portion of the first main gear 341 is inserted and a hole into which a portion of the second main gear 342 is inserted. The first bracket center 330 may have a hole vertically formed through the center of a flat upper end of the semi-elliptical shape to a lower end of the first bracket center 330. A boss 151a or 151b formed on the hinge housing 150 may be inserted into the hole vertically formed through the first bracket center 330.

The first main gear 341 may pass through the first bracket center 330 and the second bracket center 360, and one side of the first main gear 341 may be engaged with the internal gear of the first bracket inner gear 320. The first main gear 341 may include a first left penetrating part 341a that protrudes to the left portion of the first bracket inner gear 320 and that passes through the first housing washer rings 301 and 303 and the first plate spring 302, a first gear pattern part 341b that is continuous with the first left penetrating part 341a and that is engaged with the internal gear of the first bracket inner gear 320 and the first shaft-gear 351, and a first right penetrating part 341c that passes through a hole of the second bracket center 360 and on which the second gear washer ring 309 is mounted. The first main gear 341 may be divided into the first left penetrating part 341a, the first gear pattern part 341b, and the first right penetrating part 341c depending on functions or positions, and the first left penetrating part 341a, the first gear pattern part 341b, and the first right penetrating part 341c may have a continuous structure.

The first shaft-gear 351 may be engaged with the first gear pattern part 341b of the first main gear 341 and the second shaft-gear 352. Accordingly, the first shaft-gear 351 may transmit rotary power to the second shaft-gear 352 when the first main gear 341 rotates. The first shaft-gear 351 may be disposed in the cavity formed by combining the first bracket center 330 and the second bracket center 360.

The second shaft-gear 352 may be engaged with a second gear pattern part 342b of the second main gear 342 and the first shaft-gear 351. The second shaft-gear 352 may transmit rotary power to the first shaft-gear 351 while the second main gear 342 rotates. The second shaft-gear 352 may be disposed in the cavity formed by combining the first bracket center 330 and the second bracket center 360. The sizes and number of idle gears (e.g., the first shaft-gear 351 and the second shaft-gear 352) may be changed to reduce the thickness of the foldable display device 100. Accordingly, the foldable display device 100 is not limited to the number and shapes of shaft-gears. For example, to reduce the thickness of the foldable display device 100, the first shaft-gear 351 and the second shaft-gear 352 may be made compact to have a predetermined size or less. Accordingly, the foldable display device 100 may have a hinge structure including two first shaft-gears and two second shaft-gears that are half the size of one first shaft-gear or one second shaft-gear. Alternatively, the hinge structure of the foldable display device 100 may include three first shaft-gears and three second shaft-gears.

The second main gear 342 may have substantially the same form as the first main gear 341. For example, the second main gear 342 may include a second right penetrating part 342c that protrudes to the right portion of the second bracket inner gear 370 and on which the second housing washer rings 306 and 308 and the second plate spring 307 are mounted, a second gear pattern part 342b engaged with an internal gear of the second bracket inner gear 370 and the second shaft-gear 352, and a second left penetrating part 342a that passes through a hole of the first bracket center 330 and on which the first gear washer ring 304 is mounted The left or right sides of the penetrating parts described above may be based on the illustration in FIG. 10 and may be differently referred to depending on a change of the arrangement direction.

The second bracket center 360 may be disposed between the first bracket center 330 and the second bracket inner gear 370. The second bracket center 360 may have substantially the same shape as the first bracket center 330 (e.g., a semi-elliptical shape larger than the second bracket inner gear 370). The second bracket center 360 may have through-holes through which the first main gear 341 and the second main gear 342 pass, and may have a hole vertically extending from a flat upper end to a lower end for a coupling of a boss of the hinge housing 150.

The second gear washer ring 309 may be mounted in a recess of the second bracket center 360 while being coupled with the distal end of the first right penetrating part 341c of the first main gear 341.

The second bracket inner gear 370 may be disposed between the second bracket center 360 and the second bracket housing 380. The shape and material of the second bracket inner gear 370 may be substantially the same as the shape and material of the first bracket inner gear 320 described above. For example, the second bracket inner gear 370 may have a semi-elliptical shape smaller in size than the second bracket center 360 and may include, in a predetermined area, the internal gear engaged with the second main gear 342.

The second housing washer rings 306 and 308 and the second plate spring 307 may be mounted in a recess (or a hole) formed on one side of the second bracket inner gear 370 and may be coupled with the second right penetrating part 342c of the second main gear 342. The second plate spring 307 may be disposed between the second housing washer rings 306 and 308 and may apply an elastic force to the second housing washer rings 306 and 308 in the left and right directions.

The second bracket housing 380 may have substantially the same shape as the first bracket housing 310 and may be formed of substantially the same material as that of the first bracket housing 310. The second bracket housing 380 may be disposed to be directed in the opposite direction to that in which the first bracket housing 310 is directed. For example, the second bracket housing 380 may be fixed to one side of the second bracket inner gear 370 and may include a curved portion having an outer circumferential surface with a predetermined curvature and end portions that form the curved portion. Among the end portions, the upper end portion may be screw-coupled with the first housing structure 121, and the side end portion may be magnet-coupled with the second housing structure 122.

According to an embodiment, a hinge module may include a hinge housing and at least one hinge structure mounted in the hinge housing. The at least one hinge structure may include a first sub-hinge structure that includes a first center bracket fixed to the hinge housing and a first hinge bracket that is connected with the first center bracket and coupled to a first housing structure and that rotates through a specified angle in a first direction to correspond to hinge motion of the first housing structure and a second sub-hinge structure that includes a second center bracket spaced apart from the first center bracket by a predetermined distance and fixed to the hinge housing and a second hinge bracket that is connected with the second center bracket and coupled to a second housing structure and that rotates through a specified angle in a second direction opposite to the first direction. The first hinge bracket and the second hinge bracket may be separated from each other and may be disposed between the first center bracket and the second center bracket, and hinge motion of the first sub-hinge structure may be performed independently of hinge motion of the second sub-hinge structure.

The first center bracket and the second center bracket may be arranged on a first fixed axis of the hinge housing, the first hinge bracket may rotate about a first virtual axis spaced apart from the first fixed axis by a predetermined distance in the first direction and spaced apart upward from an upper surface of the first center bracket by a specified distance, and the second hinge bracket may rotate about a second virtual axis spaced apart from the first fixed axis by a predetermined distance in the second direction and spaced apart upward from an upper surface of the second center bracket by a specified distance.

The first hinge bracket and the second hinge bracket may be disposed between the first center bracket and the second center bracket.

One surface of the first hinge bracket and one surface of the second hinge bracket may face each other when the first housing structure and the second housing structure are in a flat state.

The hinge housing may include a central portion formed to be flat and a first lateral portion and a second lateral portion 800c that are formed on opposite sides of the central portion and that have a predetermined curvature.

The first center bracket may include a fixed body fixed to the central portion of the hinge housing and a connecting body disposed on the first lateral portion formed to be bent from the central portion in the first direction.

The hinge module may further include a fixing hole formed on one side of the fixed body.

The hinge module may further include a boss disposed on the central portion of the hinge housing and inserted into the fixing hole.

The hinge module may further include a protrusion protruding to a specified height from a side surface to which the first hinge bracket is coupled, among side surfaces of the fixed body and the connecting body, at least a portion of the protrusion being formed to have a predetermined curvature.

The first hinge bracket may include a rotary body that rotates along the protrusion, a base body that is spaced apart from the rotary body at a predetermined interval and to which the first housing structure is coupled, and at least one bridge that connects the rotary body and the base body.

The first hinge bracket may further include an extending body that extends from one side of the base body and that is disposed to face one side of the second hinge bracket.

The hinge module may further include one of a magnetic material or a magnetic member that is disposed on one side of the extending body.

The second center bracket may include a fixed body fixed to the central portion of the hinge housing and a connecting body disposed on the second lateral portion formed to be bent from the central portion in the second direction.

The hinge module may further include a first hinge plate coupled to the first housing structure and the first hinge bracket and a second hinge plate coupled to the second housing structure and the second hinge bracket. The first hinge bracket may include a first plate coupling hole associated with coupling the first hinge plate, and the second hinge bracket may include a second plate coupling hole associated with coupling the second hinge plate. The first plate coupling hole and the second plate coupling hole may be located on a virtual alignment line, or may be located within a specified distance from the virtual alignment line.

The hinge module may further include a connecting shaft that connects the first center bracket and the first hinge bracket and a fixing member that is disposed on one end portion of the connecting shaft and that prevents separation of the first hinge bracket and the first center bracket.

The hinge module may further include at least one of a washer ring disposed between the fixing member and the first hinge bracket and an elastic member disposed on one side of the first center bracket together with the connecting shaft.

According to an embodiment, a foldable display device may include a first housing structure, a second housing structure, a hinge module that connects the first housing structure and the second housing structure and supports hinge motions of the first housing structure and the second housing structure, and a display disposed on the first housing structure and the second housing structure. The hinge module may include a hinge housing and at least one hinge structure mounted in the hinge housing. The hinge structure may include a first sub-hinge structure that includes a first center bracket fixed to the hinge housing and a first hinge bracket that is connected with the first center bracket and coupled to the first housing structure and that rotates through a specified angle in a first direction to correspond to hinge motion of the first housing structure and a second sub-hinge structure that includes a second center bracket spaced apart from the first center bracket by a predetermined distance and fixed to the hinge housing and a second hinge bracket that is connected with the second center bracket and coupled to the second housing structure and that rotates through a specified angle in a second direction opposite to the first direction. The first hinge bracket and the second hinge bracket may be separated from each other and may be disposed between the first center bracket and the second center bracket, and hinge motion of the first sub-hinge structure may be performed independently of hinge motion of the second sub-hinge structure.

According to an embodiment, a hinge module may include a hinge housing and a first type hinge structure and a second type hinge structure that are mounted in the hinge housing. The first type hinge structure may include a first sub-hinge structure that includes a first center bracket 210 fixed to the hinge housing and a first hinge bracket that is connected with the first center bracket and coupled to a first housing structure and that rotates through a specified angle in a first direction to correspond to hinge motion of the first housing structure and a second sub-hinge structure that includes a second center bracket spaced apart from the first center bracket by a predetermined distance and fixed to the hinge housing and a second hinge bracket that is connected with the second center bracket and coupled to a second housing structure and that rotates through a specified angle in a second direction opposite to the first direction. The first sub-hinge structure and the second sub-hinge structure may be disposed so as not to be interlocked with each other. For example, the first sub-hinge structure and the second sub-hinge structure may operate independently of each other depending on the non-interlocked arrangement. For example, when the first housing structure rotates, the first sub-hinge structure connected to the first housing structure through the first hinge plate may independently operate irrespective of rotary motion of the second sub-hinge structure. For example, when the second housing structure rotates, the second sub-hinge structure connected to the second housing structure through the second hinge plate may independently operate irrespective of rotary motion of the first sub-hinge structure.

The first housing structure and the second housing structure may be fastened to the third hinge structure having an interlocking gear, and while the first housing structure rotates, the second housing structure may also rotate. Accordingly, the first sub-hinge structure and the second sub-hinge structure 202 may move together while the foldable display device is folded or unfolded. In this regard, the second type hinge structure may be configured such that the portion coupled to the first housing structure or the portion coupled to the second housing structure performs hinge motion in conjunction with a movement of one of the first housing structure and the second housing structure.

In the disclosed hinge module, the second type hinge structure may be disposed on a central area of the hinge housing, and the first type hinge structures may be disposed on opposite edge areas of the hinge housing.

The first center bracket and the second center bracket may be arranged on a fixed axis of the hinge housing. The first hinge bracket may rotate about a first virtual axis spaced apart from the fixed axis by a predetermined distance in the first direction and spaced apart upward from an upper surface of the first center bracket by a specified distance, and the second hinge bracket may rotate about a second virtual axis spaced apart from the fixed axis by a predetermined distance in the second direction and spaced apart upward from an upper surface of the second center bracket by a specified distance.

Figure 11A:
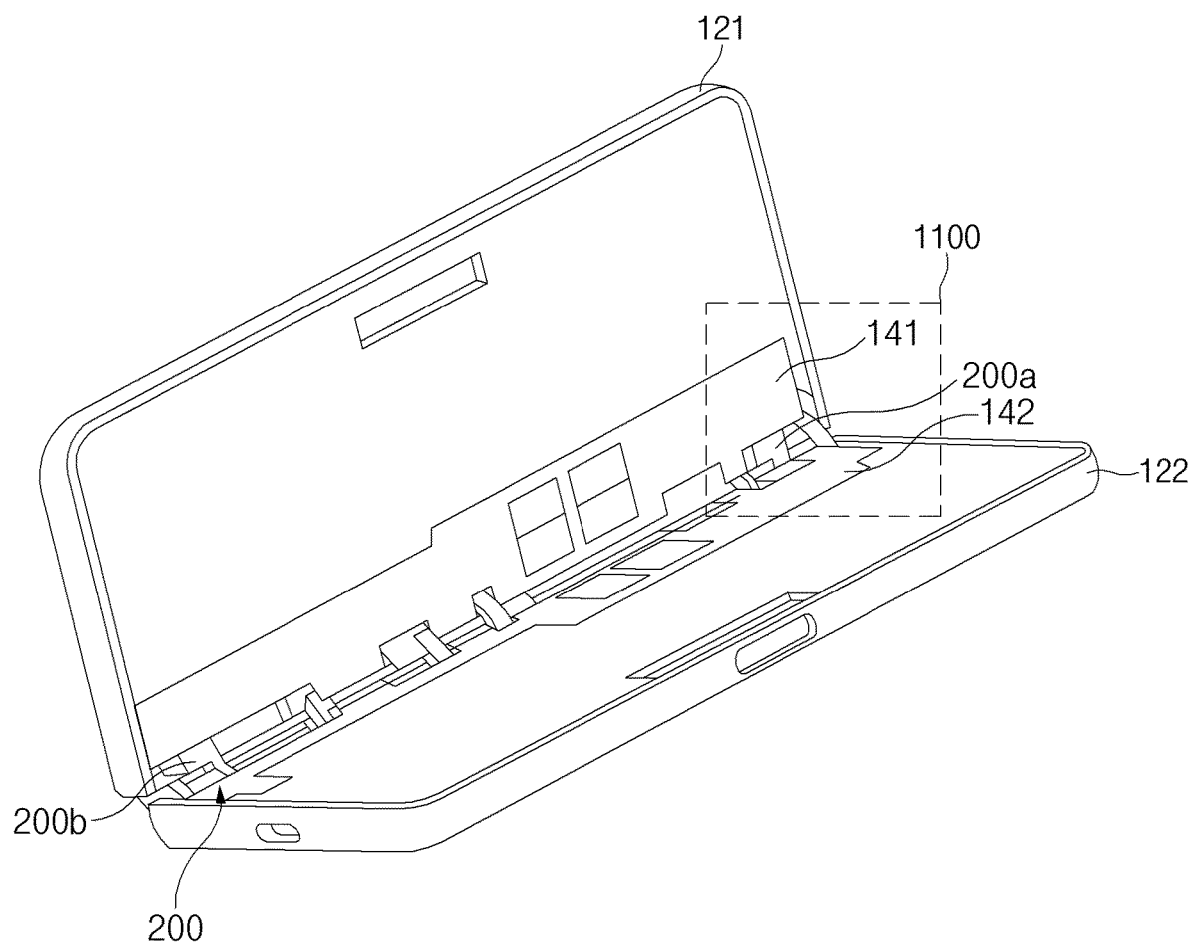
FIG. 11A illustrates a coupled form of some components of a foldable display device according to an embodiment.
Figure 11B:
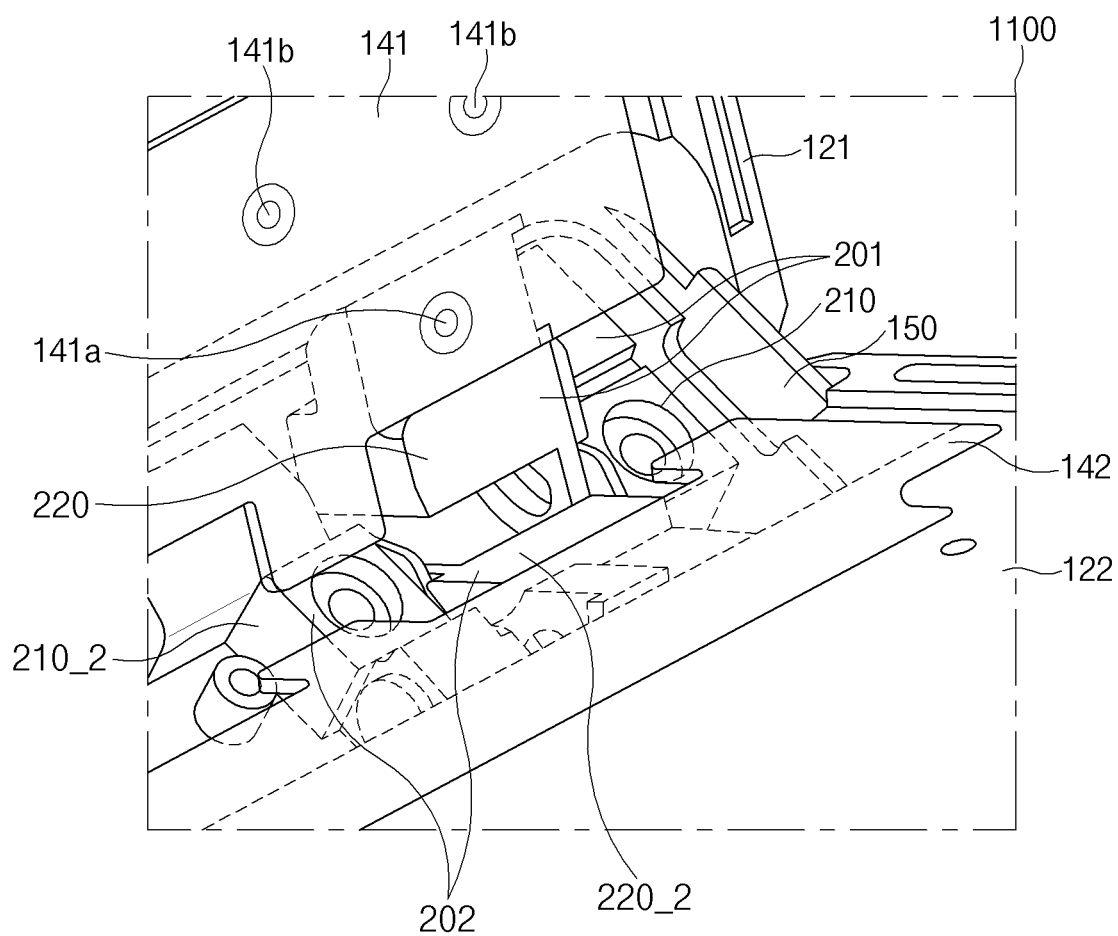
FIG. 11B is a detailed view of area "1100" in FIG. 11A.

FIG. 11A illustrates a coupled form of some components of a foldable display device according to an embodiment, and FIG. 11B is a detailed view of area 1100 in FIG. 11A.

Referring to FIGS. 11A and 11B, the foldable display device may include a first housing structure 121, a second housing structure 122, and a hinge module 200. The structures and materials of the first housing structure 121 and the second housing structure 122 may be the same as, or similar to, the structures and materials of the housing structures 121 and 122 described above with reference to FIGS. 1 and 2. The hinge module 200 may include at least some of the hinge structures 200a, 200b, and 300 described above with reference to FIGS. 2 to 10 and a hinge housing 150 in which the hinge structures 200a, 200b, and 300 are mounted. For example, the hinge module 200 may include the first hinge structure 200a and the hinge housing 150, may include the first hinge structure 200a, the third hinge structure 300, and the hinge housing 150, or may include the first to third hinge structures 200a, 200b, and 300 and the hinge housing 150.

The first housing structure 121 and the second housing structure 122 of the foldable display device having the above-described structure may rotate through a specified angle in response to external pressure. For example, the first housing structure 121 may be rotated by about 0 degrees to 45 degrees in the first rotational direction 201a by the external pressure. The second housing structure 122 may be rotated by about 0 degrees to 45 degrees in the second rotational direction 202a by the external pressure. The internal angle between the first housing structure 121 and the second housing structure 122 may be 90 degrees when the first housing structure 121 and the second housing structure 122 rotate through 45 degrees in the first rotational direction 201a and the second rotational direction 202a, respectively, when the foldable display device is flat.

When the internal angle between the first housing structure 121 and the second housing structure 122 is 90 degrees, the first hinge structure 200a may perform hinge motion. For example, the hinge brackets 220 and 220_2 disposed in the first sub-hinge structure 201 and the second sub-hinge structure 202 may perform rotary motion. The first hinge bracket 220 and the second hinge bracket 220_2 may form a specified angle (e.g., 90 degrees) to correspond to the hinge motions of the first housing structure 121 and the second housing structure 122. In this regard, the first hinge bracket 220 connected to the first center bracket 210 may rotate through 45 degrees in the first rotational direction 201a in the flat state to correspond to the rotation of the first housing structure 121. Similarly, the second hinge bracket 220_2 connected to the second center bracket 210_2 may rotate through 45 degrees in the second rotational direction 202a in the flat state to correspond to the rotation of the second housing structure 122. As the first hinge bracket 220 rotates through 45 degrees in the first rotational direction 201a and the second hinge bracket 220_2 rotates through 45 degrees in the second rotational direction 202a, the first hinge bracket 220 and the second hinge bracket 220_2 may be spaced apart from each other at a predetermined interval.

In the foldable display device, the first hinge plate 141 may include a plurality of coupling holes 141a and 141b to enable the first hinge bracket 220 to rotate depending on a movement of the first housing structure 121. For example, the first coupling hole 141a may be aligned with a plate coupling hole that is formed in the first hinge bracket 220. The second coupling hole 141b may be aligned with a coupling hole formed on one side of the first housing structure 121.

Figure 12:
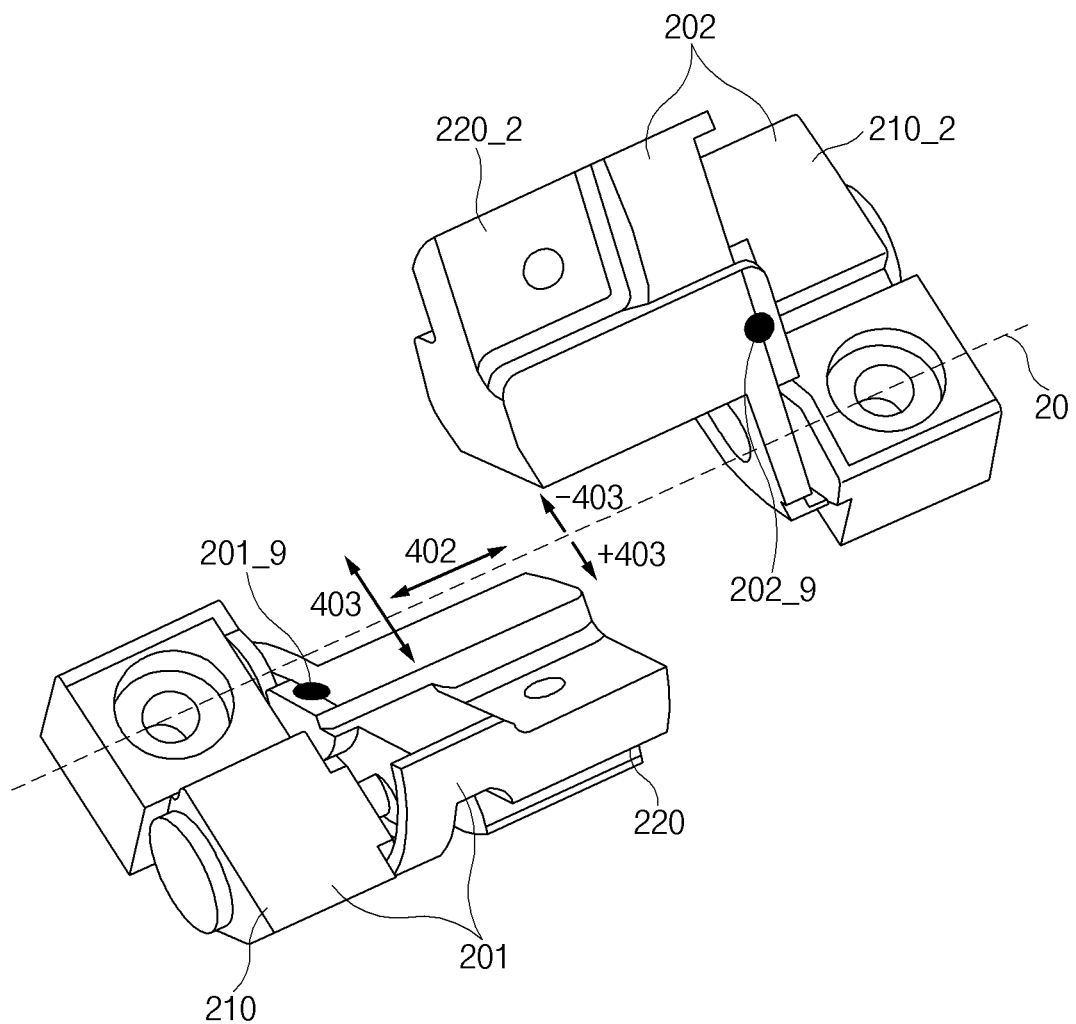
FIG. 12 illustrates the axes of rotation of the sub-hinge structures according to an embodiment.
Figure 13:
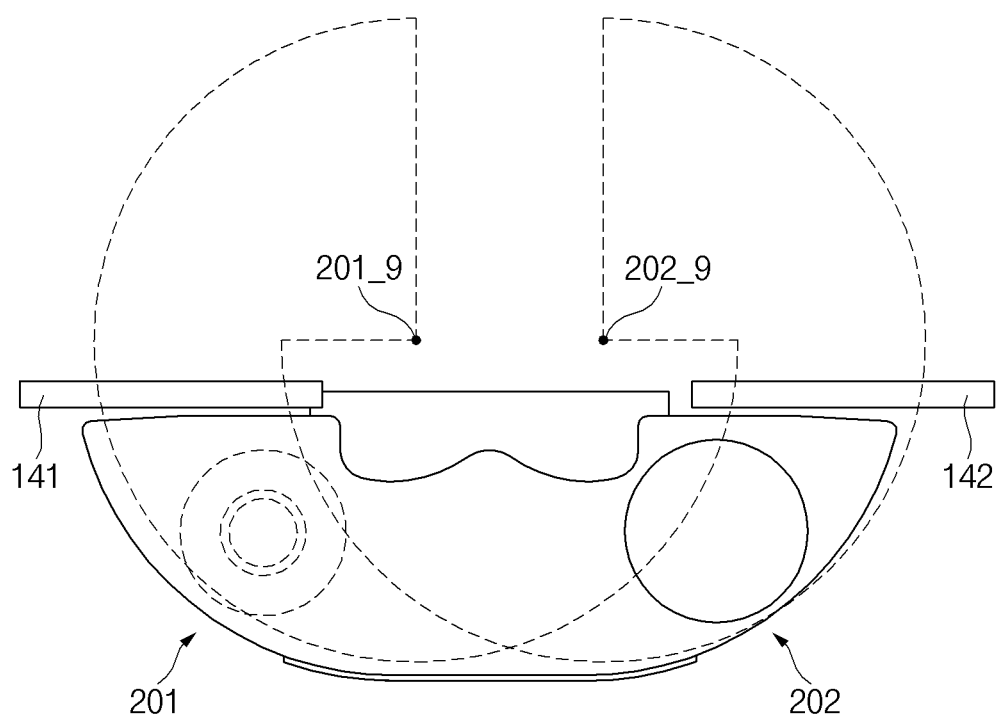
FIG. 13 illustrates the axes of rotation of the hinge structures according to an embodiment.

FIG. 12 illustrates the axes of rotation of the sub-hinge structures according to an embodiment, and FIG. 13 illustrates the axes of rotation of the hinge structures.

Referring to FIGS. 12 and 13, the first center bracket 210 of the first sub-hinge structure 201 and the second center bracket 210_2 of the second sub-hinge structure 202 may be fixed to the central portion of the hinge housing 150. Accordingly, the first center bracket 210 and the second center bracket 210_2 may be disposed on the fixed axis 20 with respect to the second axial direction 402.

The first hinge bracket 220 may rotate about a first virtual axis 201_9 that is formed in a position spaced apart from the fixed axis 20 at a predetermined interval in a first direction +403 of the third axial directions 403. The second hinge bracket 220_2 may rotate about a second virtual axis 202_9 that is formed in a position spaced apart from the fixed axis 20 at the predetermined interval in a second direction −403 of the third axial directions 403. The first virtual axis 201_9 may be formed in a position spaced apart upward from the upper surface of the first center bracket 210 by a predetermined distance, in a position spaced apart upward from the upper surface of the first housing structure 121 by a predetermined distance, or in a position spaced apart upward from the upper surface of the display 110 by a predetermined distance. Similarly, the second virtual axis 202_9 may be formed in a position spaced apart upward from the upper surface of the second center bracket 210_2 by a predetermined distance, in a position spaced apart upward from the upper surface of the second housing structure 122 by a predetermined distance, or in a position spaced apart upward from the upper surface of the display 110 by a predetermined distance. The first virtual axis 201_9 and the second virtual axis 202_9 may be formed in positions symmetric to each other in a diagonal direction with respect to the fixed axis 20.

According to an embodiment, a hinge module may include a hinge housing and at least one hinge structure mounted in the hinge housing. The hinge structure may include a first sub-hinge structure and a second sub-hinge structure that are not interlocked with each other and are fixed to the hinge housing. The first sub-hinge structure and the second sub-hinge structure may rotate through a specified angle in a first direction and in an opposite direction to the first direction, respectively, to correspond to hinge motion of a housing structure or a hinge plate coupled to the housing structure. The first sub-hinge structure may include a first center bracket mounted on one edge area of the hinge housing, a second center bracket mounted on an opposite edge area of the hinge housing that is spaced apart from the first center bracket by a predetermined distance, and a first hinge bracket and a second hinge bracket disposed between the first center bracket and the second center bracket. The first hinge bracket may be connected to the first center bracket and may rotate in a first direction, and the second hinge bracket may be connected to the second center bracket and may rotate in a second direction.

Each module or program according to embodiments may be composed of single entity or a plurality of entities, a part of the above-described sub-components may be omitted, or other sub-components may be further included. Alternatively or additionally, after being integrated in one entity, a module or a program may identically or similarly perform the function executed by each corresponding component before integration. Operations executed by modules, program, or other components may be executed by a successive method, a parallel method, a repeated method, or a heuristic method, or at least one part of operations may be executed in different sequences or omitted. Alternatively, other operations may be added.

The hinge module and the foldable display device as disclosed herein may suppress a phenomenon in which the hinge module is opened when the housing structures are twisted, thereby preventing damage to the foldable display device.

Other aspects and effects provided by the hinge module and the foldable display device according to embodiments may be realized.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A hinge module comprising:
a hinge housing; and
at least one hinge structure mounted in the hinge housing, wherein the at least one hinge structure includes:
a first sub-hinge structure including a first center bracket fixed to the hinge housing and a first hinge bracket connected with the first center bracket and coupled to a first housing structure, the first hinge bracket being rotatable through an angle in a first direction to correspond to a hinge motion of the first housing structure; and
a second sub-hinge structure including a second center bracket spaced apart from the first center bracket by a predetermined distance and fixed to the hinge housing and a second hinge bracket connected with the second center bracket and coupled to a second housing structure, the second hinge bracket being rotatable through an angle in a second direction opposite to the first direction,
wherein the first hinge bracket and the second hinge bracket are disposed to be separated from each other, and
wherein hinge motion of the first sub-hinge structure is performed independently of a hinge motion of the second sub-hinge structure.

2. The hinge module of claim 1,
wherein the first center bracket and the second center bracket are arranged on a first fixed axis of the hinge housing,
wherein the first hinge bracket rotates with reference to a first virtual axis spaced apart from the first fixed axis by a distance in the first direction and spaced apart upward from an upper surface of the first center bracket by a first specified distance, and
wherein the second hinge bracket rotates with reference to a second virtual axis spaced apart from the first fixed axis by a distance in the second direction and spaced apart upward from an upper surface of the second center bracket by a second specified distance.

3. The hinge module of claim 1,
wherein the first hinge bracket and the second hinge bracket are disposed between the first center bracket and the second center bracket.

4. The hinge module of claim 1,
wherein one surface of the first hinge bracket and one surface of the second hinge bracket face each other when the first housing structure and the second housing structure are in a flat state.

5. The hinge module of claim 1, wherein the hinge housing includes:
a central portion formed to be flat; and
a first lateral portion and a second lateral portion formed on opposite sides of the central portion and having a predetermined curvature.

6. The hinge module of claim 5, wherein the first center bracket includes:
a fixed body fixed to the central portion of the hinge housing; and
a connecting body disposed on the first lateral portion formed to be bent from the central portion in the first direction.

7. The hinge module of claim 6, further comprising:
a fixing hole formed on one side of the fixed body.

8. The hinge module of claim 7, further comprising:
a boss disposed on the central portion of the hinge housing and inserted into the fixing hole.

9. The hinge module of claim 6, further comprising:
a protrusion protruding to a specified height from a side surface to which the first hinge bracket is coupled, among side surfaces of the fixed body and the connecting body,
wherein at least a portion of the protrusion is formed to have a predetermined curvature.

10. The hinge module of claim 9, wherein the first hinge bracket includes:
a rotary body configured to rotate along the protrusion;
a base body that is spaced apart from the rotary body at an interval and to which the first housing structure is coupled; and
at least one bridge configured to connect the rotary body to the base body.

11. The hinge module of claim 10,
wherein the first hinge bracket further includes an extending body extending from one side of the base body, the extending body being disposed to face one side of the second hinge bracket.

12. The hinge module of claim 11, further comprising:
a magnetic material or a magnetic member that is disposed on one side of the extending body.

13. The hinge module of claim 5, wherein the second center bracket includes:

a fixed body fixed to the central portion of the hinge housing; and
a connecting body disposed on the second lateral portion and formed to be bent from the central portion in the second direction.

14. The hinge module of claim 1, further comprising:
a first hinge plate coupled to the first housing structure and the first hinge bracket; and
a second hinge plate coupled to the second housing structure and the second hinge bracket,
wherein the first hinge bracket includes a first plate coupling hole associated with coupling the first hinge plate to the first hinge bracket,
wherein the second hinge bracket includes a second plate coupling hole associated with coupling the second hinge plate to the second hinge bracket, and
wherein the first plate coupling hole and the second plate coupling hole are located on a virtual alignment line or within a specified distance from the virtual alignment line.

15. The hinge module of claim 1, further comprising:
a connecting shaft configured to connect the first center bracket to the first hinge bracket; and
a fixing member disposed on one end portion of the connecting shaft and configured to prevent separation of the first hinge bracket and the first center bracket.

16. The hinge module of claim 15, further comprising at least one of:
at least one washer ring disposed between the fixing member and the first hinge bracket; and
an elastic member disposed on one side of the first center bracket together with the connecting shaft.

17. A foldable display device comprising:
a first housing structure;
a second housing structure;
a hinge module configured to connect the first housing structure to the second housing structure and support hinge motions of the first housing structure and the second housing structure; and
a display continuously disposed on the first housing structure and the second housing structure,
wherein the hinge module includes:
a hinge housing; and
at least one hinge structure mounted in the hinge housing,
wherein the at least one hinge structure includes:
a first sub-hinge structure including a first center bracket fixed to the hinge housing and a first hinge bracket connected with the first center bracket and coupled to the first housing structure, the first hinge bracket being configured to rotate through an angle in a first direction to correspond to a hinge motion of the first housing structure; and
a second sub-hinge structure including a second center bracket spaced apart from the first center bracket by a predetermined distance and fixed to the hinge housing and a second hinge bracket connected with the second center bracket and coupled to the second housing structure, the second hinge bracket being configured to rotate through an angle in a second direction opposite to the first direction,
wherein the first hinge bracket and the second hinge bracket are disposed to be separated from each other, and
wherein hinge motion of the first sub-hinge structure is performed independently of a hinge motion of the second sub-hinge structure.

18. The foldable display device of claim 17,
wherein the first center bracket and the second center bracket are arranged on a first fixed axis of the hinge housing,
wherein the first hinge bracket rotates with reference to a first virtual axis spaced apart from the first fixed axis by a distance in the first direction and spaced apart upward from an upper surface of the first center bracket by a first specified distance, and
wherein the second hinge bracket rotates with reference to a second virtual axis spaced apart from the first fixed axis by a distance in the second direction and spaced apart upward from an upper surface of the second center bracket by a second specified distance.

19. The foldable display device of claim 17,
wherein the first hinge bracket and the second hinge bracket are disposed between the first center bracket and the second center bracket.

20. The foldable display device of claim 17,
wherein one surface of the first hinge bracket and one surface of the second hinge bracket face each other when the first housing structure and the second housing structure are in a flat state.

* * * * *